United States Patent
Banna et al.

(10) Patent No.: US 8,531,878 B2
(45) Date of Patent: Sep. 10, 2013

(54) TECHNIQUES FOR PROVIDING A SEMICONDUCTOR MEMORY DEVICE

(75) Inventors: Srinivasa Rao Banna, San Jose, CA (US); Michael A. Van Buskirk, Saratoga, CA (US); Timothy Thurgate, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 13/109,821

(22) Filed: May 17, 2011

(65) Prior Publication Data
US 2012/0294083 A1   Nov. 22, 2012

(51) Int. Cl.
G11C 11/34   (2006.01)
G11C 16/04   (2006.01)

(52) U.S. Cl.
USPC .............................. 365/185.05; 365/185.08

(58) Field of Classification Search
USPC .............. 365/185.01–185.33, 189.011–225.7
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Harry W Byrne
(74) *Attorney, Agent, or Firm* — Wilmer Cutler Pickering Hale and Dorr LLP

(57) ABSTRACT

Techniques for providing a semiconductor memory device are disclosed. In one particular embodiment, the techniques may be realized as a semiconductor memory device including a plurality of memory cells arranged in an array of rows and columns, each memory cell. Each of the memory cell may include a first region coupled to a source line, a second region coupled to a bit line, and a body region capacitively coupled to at least one word line via a gate region and disposed between the first region and the second region, wherein the body region may include a plurality of floating body regions and a plurality of floating gate regions capacitively coupled to the at least one word line.

32 Claims, 13 Drawing Sheets

(56) References Cited

U.S. PATENT DOCUMENTS

| | | |
|---|---|---|
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |

| | | |
|---|---|---|
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1* | 5/2010 | Nautiyal et al. ............... 365/222 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |

| | | |
|---|---|---|
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | 08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 2001/024268 | 4/2001 |
| WO | 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architecture of Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFET's", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI Flash Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces, Responsible for Junction Leakage, ICSI, May 19, 2009.
Lončar et al., "One of Application of SOI Memory Cell—Memory Array", IEEE Proc. 22nd International Conference on Microelectronics (MIEL 2000), vol. 2, NIS, Serbia, 14-17 May 2000, pp. 455-458.
Lu et al., A Novel Two-Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOSIV) for 128Mb SOI DRAM, 2005, IEDM.
Mohapatra et al., Effect of Source/Drain Asymmetry on the Performance of Z-RAMòDevices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect In Floating Body Soi Mosfets by The Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFET's, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFET's, May 2002, Electron Device Letters.
Okhonin, Transient Charge Pumping for Partially and Fully Depleted SOI MOSFET's, 2002, SOI Conference.
Okhonin, Transient effects in PD SOI MOSFET's and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFET's", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.

Puget et al., Quantum effects influence on thin silicon film capacitorless DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFET's and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.

Tanabe et al., A 30-ns. 64-MB DRAM with Built-in-Self-Test .and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15µm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting- Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFET's", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

|  | Erase | Pgm | Read |
|---|---|---|---|
| CN(0) | Open | 0 | 1 |
| CN(1) | Open | 7 | 1 |
| SG1 | -5 | 16-20 | 5 |
| CG(0) | -16/-20 | 7 | 5 |
| CG(1) | -16/-20 | 16-20 | 0 |
| CG(n) | -16/-20 | 7 | 5 |
| SG2 | -5 | 0 | 5 |
| Source | -1 | 0 | 0 |
| P-Well/P-Inj | 0 | 0 | 0 |
| N-Well | 1 | 0 | 0 |
| Time | ~2ms | 300uS | 10uS |

FIGURE 4

| | Erase | Pgm | Read |
|---|---|---|---|
| CN1 | open | 0 | 0 |
| CN2 | open | 5 | 0 |
| SG1 | -5 | 5 | 5 |
| CG(0) | -16 ~ -20 | 7 | 5 |
| CG(1) | -16 ~ -20 | 16 ~ 20 | 0 |
| CG(n) | -16 ~ -20 | 7 | 5 |
| SG2 | -5 | 5 | 5 |
| Source/Pwell | 1 | 0 | 1 |
| N-Well | 1 | 0 | 1 |
| Time | ~2ms | 300us | 10uS |

FIGURE 10

TECHNIQUES FOR PROVIDING A SEMICONDUCTOR MEMORY DEVICE

FIELD OF THE DISCLOSURE

The present disclosure relates generally to semiconductor memory devices and, more particularly, to techniques for providing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating gate region wherein electrical charge may be stored. When excess majority electrical charges carriers are stored in the electrically floating gate region, the memory cell may store a logic high (e.g., binary "1" data state). When the electrical floating gate region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

There have been significant problems associated with conventional techniques for providing conventional semiconductor memory devices. For example, conventional semiconductor memory devices may have a channel length that may be susceptible to short-channel effects (SCE). Also, conventional semiconductor memory devices may experience interference between floating gates of adjacent memory cells. Further, conventional semiconductor memory devices may experience leakage of charge carriers stored in the memory cell due to memory cell noises and variations.

In view of the foregoing, it may be understood that there may be significant problems and shortcomings associated with conventional techniques for providing a semiconductor memory device.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be illustrative only.

FIG. 4 shows voltage potential levels of various methods for performing a write operation and a read operation on a memory cell as shown in FIGS. 1-3 in accordance with an embodiment of the present disclosure.

FIG. 10 shows voltage potential levels of various methods for performing a write operation and a read operation on a memory cell as shown in FIGS. 7-9 in accordance with an embodiment of the present disclosure.

DETAILED DESCRIPTION OF EMBODIMENTS

Figure 1:
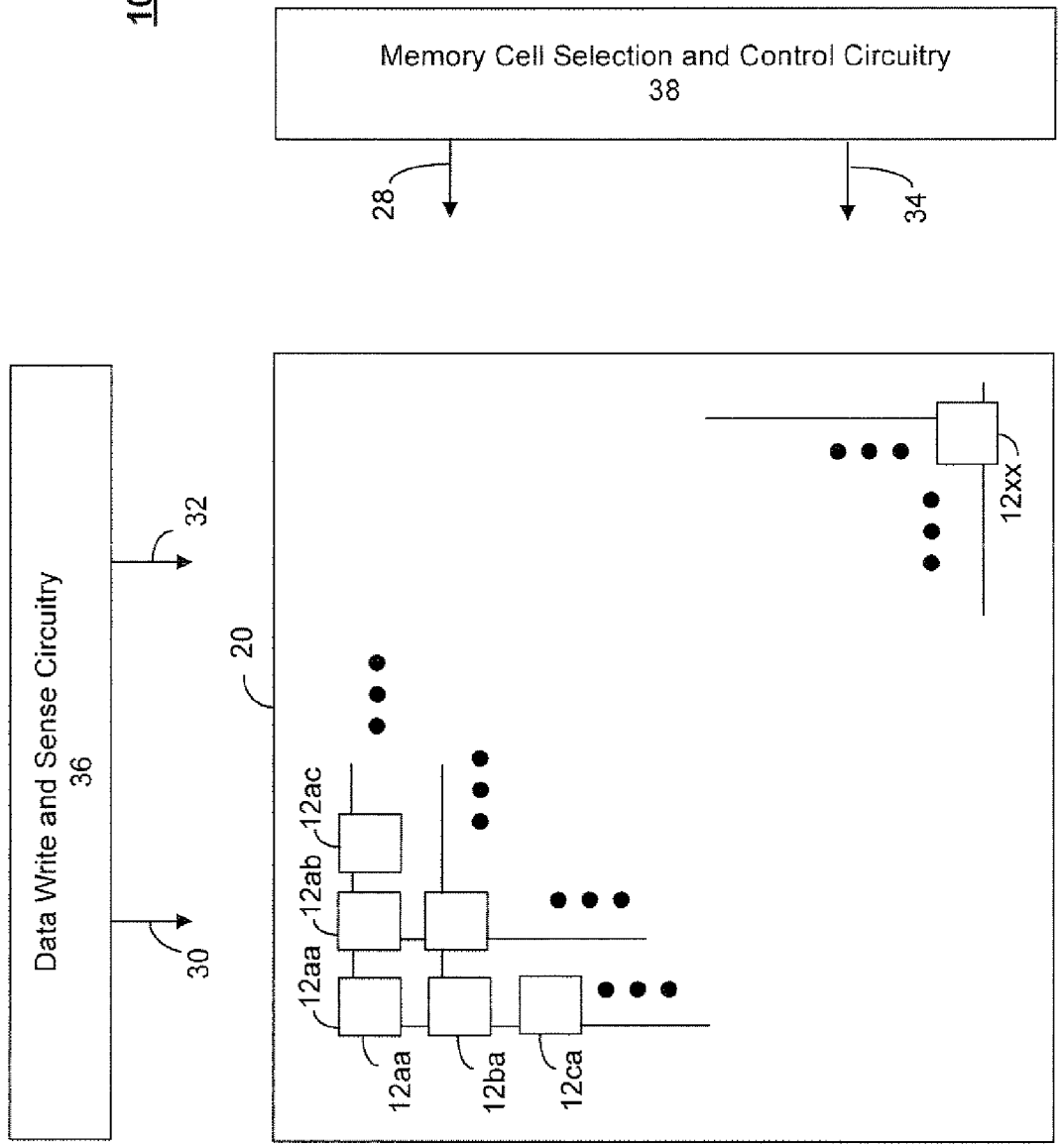
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and to the data write and sense circuitry 36 via a bit line (CN) 30 and a source line (EN) 32. It may be appreciated that the bit line (CN) 30 and the source line (EN) 32 are designations used to distinguish between two signal lines and they may be used interchangeably.

The data write and sense circuitry 36 may read data from and may write data to selected memory cells 12. In an embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled type sense amplifier to sense a data state stored in a memory cell 12. The data write and sense circuitry 36 may include at least one multiplexer that may couple to a data sense amplifier circuit to at least one bit line (CN) 30. In an embodiment, the multiplexer may couple a plurality of bit lines (CN) 30 to a data sense amplifier circuit.

Each data sense amplifier circuit may employ voltage and/or current sensing circuitry and/or techniques. In an embodiment, each data sense amplifier circuit may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28 and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry thereof) to select and/or enable one or more predetermined memory cells 12. Notably, all such control/selection techniques, and circuitry thereof, whether now known or later developed, are intended to fall within the scope of the present disclosure.

In an embodiment, the semiconductor memory device 10 may implement a two step write operation whereby all the memory cells 12 in a row of memory cells 12 may be written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 may be selectively written to the predetermined data state (e.g., a logic high (binary "1" data state)). The semiconductor memory device 10 may also implement a one step write operation whereby selected memory cells 12 in a row of memory cells 12 may be selectively written to either a logic high (e.g., binary "1" data state) or a logic low (e.g., binary "0" data state) without first implementing a "clear" operation. The semiconductor memory device 10 may employ any of the writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
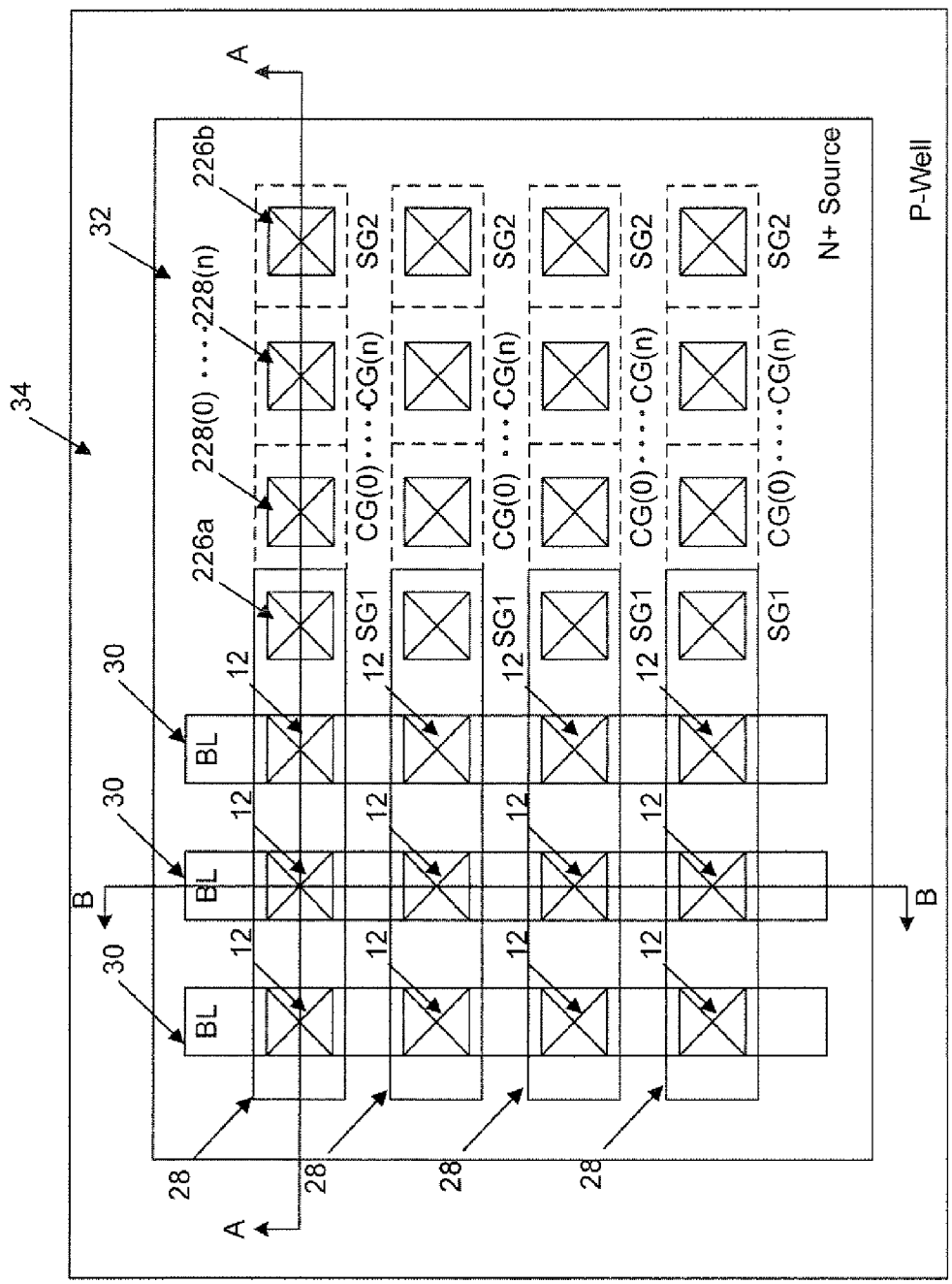
FIG. 2 shows a top view of at least a portion of the memory cell array shown in FIG. 1 in accordance with an embodiment of the present disclosure.

Referring to FIG. 2, there is shown a top view of at least a portion of the memory cell array 20 shown in FIG. 1 in accordance with an embodiment of the present disclosure. As illustrated in the top view, the memory cell array 20 may include a plurality of memory cells 12 arranged in a matrix of rows and columns including a plurality of word lines 28 (WL), a plurality of bit lines (CN) 30, a source line plate (EN) 32 and/or a carrier injection line plate (EP) 34. Each bit line (CN) 30 may extend in a first orientation along a first plane of the memory cell array 20. The source line plate (EN) 32 may extend in the first orientation and a second orientation along a second plane of the memory cell array 20. In an embodiment, the source line plate (EN) 32 may be formed of an N-type semiconductor material. The carrier injection line plate (EP) 34 may extend in the first orientation and the second orientation along a third plane of the memory cell array 20. Each word line (WL) 28 may extend in the second orientation along a fourth plane of the memory cell array 20. The first plane, the second plane, the third plane, and the fourth plane of the memory cell array 20 may be arranged in different planes parallel to each other.

The plurality of word lines (WL) 28 may be formed of a polycide material (e.g., a combination of a metal material and a silicon material), a metal material, and/or a combination of a polycide material and a metal material. In an embodiment, the word lines (WL) 28 may capacitively couple a voltage potential/current source of the memory cell selection and control circuitry 38 to the memory cells 12. The word line (WL) 28 may be formed of a plurality layers. Each layer of the word line (WL) 28 may be formed of different materials. In an embodiment, the first layer of the word line (WL) 28 may be formed of a silicon material and the second layer of the word line (WL) 28 may be formed of a metal material.

The plurality of word lines (WL) 28 may comprise a plurality of gate lines. The plurality of gate lines may include a plurality of select gate (SG) lines 234 (not shown) and a plurality of control gate (CG) lines 236 (not shown). In an embodiment, the plurality of word lines (WL) 28 may comprise at least two select gate lines 234a-b. The plurality of word lines (WL) 28 may comprise a predetermined number of control gate (CG) lines 236(0-n). Each of the plurality of select gate (SG) lines 234a-b may be coupled to a corresponding select gate (SG) line contact 226. Each of the plurality of control gate (CG) lines 236(0-n) may be coupled to a corresponding control gate (CG) line contact 228.

The plurality of control gate (CG) line contacts 228(0-n) may be arranged between the plurality of select gate (SG) contacts 234. The plurality of select gate (SG) line contacts 226a-b and the plurality of control gate (CG) line contacts 228(0-n) may be arranged in the same plane. In an embodiment, the plurality select gate (SG) line contacts 226 and the plurality of control gate (CG) line contacts 228 may be arranged in the same plane as the bit line (CN) 30. The plurality of select gate (SG) line contacts 226 and the plurality of control gate (CG) line contacts 228 may be arranged on a side portion of the memory cell array 20.

Figure 3:
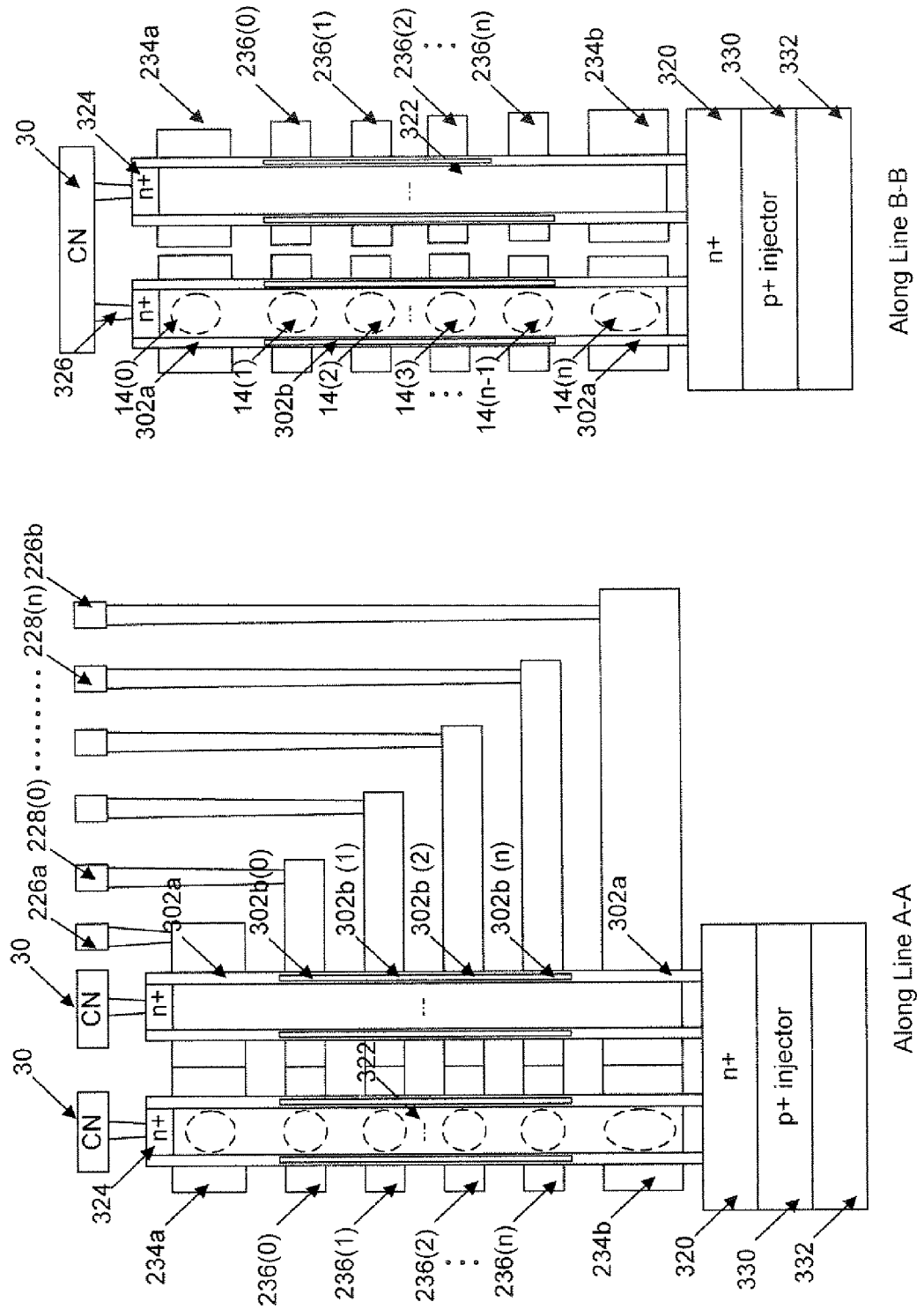
FIG. 3 shows cross-sectional views of at least a portion of the memory cell array as shown in FIG. 2 in accordance with an embodiment of the present disclosure.

Referring to FIG. 3, there are shown cross-sectional views of at least a portion of the memory cell array 20 as shown in FIG. 2 in accordance with an embodiment of the present disclosure. FIG. 3 illustrates a cross-sectional view of at least a portion of the memory cell array 20 along line A-A and a cross-sectional view of at least a portion of the memory cell array 20 along line B-B. The memory cells 12 of the memory cell array 20 may be implemented in a vertical configuration having various regions. For example, the memory cell 12 may comprise a source region 320, a body region 322, and a drain region 324. The source region 320, the body region 322, and/or the drain region 324 may be disposed in a sequential contiguous relationship, and may extend vertically from a plane defined by a P+ region 330 and/or an N+ substrate 332. The source region 320 of the memory cell 12 may be coupled to the source line (EN) 32. The body region 322 may comprise a plurality of floating body regions 14(0-n) and a plurality of corresponding floating gate regions 302b(0-n) configured to accumulate/store charges, and may be spaced apart from and capacitively coupled to the plurality of word lines (WL) 28. The drain region 324 of the memory cell 12 may be coupled to the bit line (CN) 30.

The source region 320 of the memory cell 12 may be coupled to a corresponding source line (EN) 32. In an embodiment, the source region 320 may be formed of a semiconductor material (e.g., silicon) comprising donor impurities. For example, the source region 320 may be formed of a silicon material doped with phosphorous or arsenic impurities. In an embodiment, the source region 320 may be formed of a silicon material doped with phosphorous or arsenic having a concentration of approximately $10^{20}$ atoms/cm$^3$ or above. The source region 320 may comprise a plate having continuous planar region configured above the P+ region 330 and/or the N+ substrate 332. The source region 320 may also comprise a plurality of protrusions formed on the continuous planar region of the plate. The plurality of protrusions of the source region 320 may be oriented in a column direction and/or a row direction of the memory cell array 20. The plurality of protrusions of the source region 320 may form the base of the memory cell 12.

In an embodiment, the source line (EN) 32 may be configured as the plate having continuous planar region of the source region 320. In an embodiment, the source line (EN) 32 may be formed of an N+ doped silicon layer. In another embodiment, the source line (EN) 32 may be formed of a metal material. In other embodiments, the source line (EN) 32 may be formed of a polycide material (e.g., a combination of a metal material and a silicon material). The source line (EN) 32 may couple a predetermined voltage potential to the memory cells 12 of the memory cell array 20. For example, the source line (EN) 32 may be coupled to a plurality of memory cells 12 (e.g., a column or a row of memory cell array 20).

The body region 322 of the memory cell 12 may be capacitively coupled to a corresponding word line (WL) 28 via the floating gate region 302. In an embodiment, the body region 322 may be formed of undoped semiconductor material (e.g., intrinsic silicon). In another embodiment, the body region 322 may be formed of a semiconductor material (e.g., silicon) comprising acceptor impurities. For example, the body region 322 may be formed of a silicon material doped with boron impurities. The body region 322 may be formed of a silicon material with acceptor impurities having a concentration of $10^{15}$ atoms/cm$^3$.

The body region 322 may comprise a plurality of floating body regions 14(0-n) and a plurality of corresponding floating gate regions 302b(0-n). For example, charge carriers may be accumulated/stored in the plurality of floating gate regions 302b(0-n) corresponding to the plurality of floating body region 14(0-n) in order to represent a data state (e.g., a logic low (e.g., binary "0" data state) and/or a logic high (e.g., binary "1" data state)). Each of the plurality of floating body regions 14(0-n) may be capacitively coupled to a corresponding select gate (SG) line 234 or a corresponding control gate (CG) line 236. In an embodiment, a first floating body region 14(0) may be capacitively coupled to a corresponding first select gate (SG) line 234a. The last floating body region 14(n) may be capacitively coupled to a corresponding second select gate (SG) line 234b. One or more intervening floating body regions 14(1, . . . , n–1) may be capacitively coupled to a plurality of control gate (CG) lines 236(0-n). The plurality of floating body regions 14(0-n) may be accessible via the first select gate (SG) line 234a and/or the second select gate (SG) line 234b.

As discussed above, the plurality of word lines (WL) 28 may comprise a plurality of select gate (SG) line 234 and/or a plurality of control gate (CG) lines 236(0-n). The plurality of select gate (SG) lines 234 and the plurality of control gate (CG) lines 236(0-n) may be arranged in a sequential contiguous relationship extending from a vertical direction of the body region 322. For example, the plurality of control gate (CG) lines 236(0-n) may be arranged between the plurality of select gate (SG) lines 234a-b. In an embodiment, the first select gate (SG) lines 234a may be arranged contiguous to the source region 320 and the second select gate (SG) lines 234b may be arranged contiguous to the drain region 324. The plurality of control gate (CG) lines 236(0-n) may be arranged between the first select gate (SG) lines 234a and the second select gate (SG) lines 234b.

The plurality of select gate (SG) lines 234 may have different length in order to make contact with the plurality of select gate (SG) line contacts 226. The length of the plurality of select gate (SG) lines 234 may be based at least in part on a location of the select gate (SG) lines 234. For example, a first select gate (SG) line 234 may have a length shorter than a second select gate (SG) line 234 that is located below the first select gate (SG) line 234. In an embodiment, the first select gate (SG) line 234a may have a length longer than the second select gate (SG) line 234b, when the first select gate (SG) line 234a is located below the second select gate (SG) line 234b. The plurality of control gate (CG) lines 236(0-n) may have different length in order to make contact with the plurality of control gate (CG) line contact 228(0-n). The length of the plurality of control gate (CG) lines 236(0-n) may be based at least in part on a location of the control gate (CG) line 236. For example, the length of the control gate (CG) lines 236 may increase as the control gate (CG) lines 236 are located closer to the source region 320. In an embodiment, the first control gate (CG) line 236(0) may have a length shorter than the second control gate (CG) line 236(1). The second control gate (CG) line 236(1) may have a length shorter than the third control gate (CG) line 236(2), etc. Finally, the last control gate (CG) line 236(n) may have the longest length of the plurality of control gate (CG) lines 236.

The plurality of word lines (WL) 28 may be capacitively coupled to a plurality of memory cells 12 via the floating gate region 302. The floating gate region 302 may comprise of two end portions 302a and a middle portion 302b. In an embodiment, the two end portions 302a and the middle portion 302b may be formed of the same material. In another embodiment, different portions of the floating gate region 302 may be formed of different material. In an embodiment, the two end portions 302a of the floating gate region 302 may be formed of an oxide and/or a thermal oxide material. The middle portion 302b of the floating gate region 302 comprising a plurality of floating gate regions 302b(0-n) may be formed of an oxide material, a thermal oxide material and/or a nitride material. For example, the middle portion 302b of the floating gate region 302 may be formed of a nitride material embedded in an oxide material and/or a thermal oxide material. In an embodiment, the embedded nitride material of the middle portion 302b of the floating gate region 302 may accumulate/store a predetermined amount of charge carriers in order to represent a data state (e.g., a logic low (e.g., binary "0" data state) and/or a logic high (e.g., binary "1" data state)). The two end portions 302a of the floating gate region 302 may capacitively couple the plurality of select gate (SG) lines 234 to the body region 322. The middle portion 302b of the floating gate region 302 may capacitively couple the plurality of control gate (CG) lines 236 to the body region 322.

The plurality of select gate (SG) lines 234 may be coupled to the plurality of select gate (SG) line contacts 226 and the plurality of control gate (CG) lines 236 may be coupled to the plurality of control gate (CG) line contacts 228. The select gate (SG) line contacts 226 may be formed of a metal layer or a polysilicon layer in order to couple a voltage potential and/or current to the select gate (SG) line 234. The control gate (CG) line contacts 228 may be formed of a metal layer or a polysilicon layer in order to couple a voltage potential and/or current to the control gate (CG) lines 236. For example, the select gate (SG) line contacts 226 and the control gate (CG) line contact 228 may be formed of tungsten, titanium, titanium nitride, polysilicon or a combination thereof. The select gate (SG) line contacts 226 may have a height extending down to the select gate (SG) lines 234. The control gate (CG) line contact 228 may have a height extending down to the control gate (CG) lines 236.

The drain region 324 of the memory cell 12 may be coupled to a corresponding bit line (CN) 30. In an embodiment, the drain region 324 of the memory cell 12 may be formed of a semiconductor material (e.g., silicon) comprising donor impurities. For example, the drain region 324 may be formed of a silicon material doped with phosphorous or arsenic impurities. In an embodiment, the drain region 324 may be formed of a silicon material doped with phosphorous or arsenic having a concentration of approximately $10^{20}$ atoms/cm$^3$ or above.

The bit line (CN) 30 may be coupled to the drain region 324 of the memory cell 12. The bit line (CN) 30 may be formed of a metal material. In another embodiment, the bit line (CN) 30 may be formed of a polycide material (e.g., a combination of a metal material and a silicon material). In other embodiments, the bit line (CN) 30 may be formed of an N+ doped silicon layer. For example, the bit line (CN) 30 may be coupled to a plurality of memory cells 12. The bit line (CN) 30 may be configured above the drain region 324.

The bit line (CN) 30 may be connected to a plurality of memory cells 12 (e.g., a column of memory cells 12) via a plurality of bit line contacts 326. For example, each bit line contact 326 may correspond to a memory cell 12 along a column direction of the memory cell array 20. Each bit line contact 326 may be formed of a metal layer or a polysilicon layer in order to couple a voltage potential from the bit line (CN) 30 to the drain region 324 of the memory cell 12. For example, the bit line contact 326 may be formed of tungsten, titanium, titanium nitride, polysilicon or a combination thereof. The bit line contact 326 may have a height extending from the bit line (CN) 30 to the drain region 324 of the memory cell 12.

The p+ region 330 may be coupled to a corresponding carrier injection line plate (EP) 34. In an embodiment, the P+ region 330 may be made of a semiconductor material (e.g., silicon) comprising acceptor impurities. For example, the P+ region 330 may be made of a semiconductor material comprising boron impurities. In an embodiment, the P+ region 330 may be made of silicon comprising boron impurities having a concentration of approximately $10^{23}$ atoms/cm$^3$ or above. Also, the P+ region 330 may be made in the form of a P-well region.

The carrier injection line plate (EP) 34 may be coupled to the P+ region 330 of the memory cell 12. In an embodiment, the carrier injection line plate (EP) 34 may be formed of a P+ doped silicon layer. In another embodiment, the carrier injection line plate (EP) 34 may be formed of a metal material. In other embodiments, the carrier injection line plate (EP) 34 may be formed of a polycide material (e.g., a combination of a metal material and a silicon material). For example, the carrier injection line plate (EP) 34 may be coupled to a plurality of memory cells 12.

The N+ substrate 332 may be made of a semiconductor material (e.g., silicon) comprising donor impurities and may form a base of the memory cell array 20. For example, the N+ substrate 332 may be made of a semiconductor material comprising phosphorous or arsenic impurities. In an embodiment, the N+ substrate 332 may be made of silicon comprising phosphorous or arsenic impurities having a concentration of approximately $10^{23}$ atoms/cm$^3$ or above. In alternative embodiments, a plurality of N+ substrates 332 may form the base of the memory cell array 20 or a single N+ substrate 330 may form the base of the memory cell array 20. Also, the N+ substrate 332 may be made in the form of an N-well substrate.

Referring to FIG. 4, there is shown voltage potential levels of various methods for performing a write operation and a read operation on a memory cell 12 as shown in FIGS. 1-3 in accordance with an embodiment of the present disclosure. The write operation may include a write logic low (e.g., binary "0" data state) operation and a write logic high (e.g., binary "1" data state) operation. In an embodiment, the various methods of performing a write logic low (e.g., binary "0" data state) operation may be accomplished via an erase operation. In another embodiment, the various methods of performing a write logic high (e.g., binary "1" data state) operation may be accomplished via a program operation.

The erase operation may perform a write logic low (e.g., binary "0" data state) operation by depleting charge carriers (e.g., electrons) stored in the memory cell 12. During the erase operation, a positive voltage potential may be applied to the N+ substrate 332. In an embodiment, 1.0V may be applied to the N+ substrate 332. The P+ region 330 may be coupled to an electrical ground (e.g., 0V). The plurality of bit lines (CN) may be decoupled from a voltage potential source and/or current source and may be electrical open or electrically floating. A negative voltage potential may be applied to the source region 320. The negative voltage potential applied to the source region 320 may forward bias the junction between the source region 320 and the P+ region 330. In an embodiment, the negative voltage potential applied to the source region 320 may be −1.0V. Simultaneously to or after forward biasing the junction between the source region 320 and the P+ region 330, a plurality of negative voltage potentials may be applied to the plurality of word lines (WL) 28 (e.g., that may be capacitively coupled to the body region 322). For example, different negative voltage potentials may be applied to the plurality of select gate (SG) lines 234 and the plurality of control gate (CG) lines 236. In an embodiment, the negative voltage potentials applied to the plurality of select gate (SG) lines 234 may be −5.0V. The negative voltage potentials applied to the plurality of control gate (CG) lines 236 may be approximately −16.0V to −20.0V. The negative voltage potential applied to the plurality of word lines (WL) 28 may attract holes that are injected into the body region 322 via the forward biased junction between the source region 320 and the P+ region 330. The attraction of the holes into the body region 322 may cause a removal of the electrons that may have accumulated/stored in the floating body region 302b (e.g., the embedded nitride material) to represent that a logic low (e.g., binary "0" data state) may be written to the memory cell 12.

The erase operation may perform a write logic low (e.g., binary "0" data state) operation by accumulate/store minority charge carriers (e.g., holes) in order to compensate for the majority charge carriers (e.g., electrons) that may have accumulated/stored in the memory cell 12. During the erase operation, a positive voltage potential may be applied to the N+ substrate 332. In an embodiment, 1.0V may be applied to the N+ substrate 332. The P+ region 330 may be coupled to an electrical ground (e.g., 0V). The plurality of bit lines (CN) may be decoupled from a voltage potential source and/or current source and may be electrically open or electrically floating. A negative voltage potential may be applied to the source region 320. The negative voltage potential applied to the source region 320 may forward bias the junction between the source region 320 and the P+ region 330. In an embodiment, the negative voltage potential applied to the source region 320 may be −1.0V.

Simultaneously to or after forward bias the junction between the source region 320 and the P+ region 330, a plurality of negative voltage potentials may be applied to the plurality of word lines (WL) 28 (e.g., that may be capacitively coupled to the body region 322). For example, different negative voltage potentials may be applied to the plurality of select gate (SG) lines 234 and the plurality of control gate (CG) lines 236. In an embodiment, the negative voltage potentials applied to the plurality of select gate (SG) lines 234 may be −5.0V. The negative voltage potentials applied to the plurality of control gate (CG) lines 236 may be approximately −16.0V to −20.0V.

Due to the forward biased junction between the P+ region 330 and the source region 320 and/or the negative voltage potentials applied to the plurality of word lines (WL) 28, minority charge carriers (e.g., holes) may be injected into the body region 322. The injection of the minority charge carriers (e.g., holes) into the body region 322 may cause an injection of minority charge carriers (e.g., holes) into the floating gate region 302b (e.g., the embedded nitride material) to represent that a logic low (e.g., binary "0" data state) may be written to the memory cell 12. A predetermined amount of minority charge carriers (e.g., holes) may be accumulated/stored in the floating gate region 302b of the body region 322 of the memory cell 12. The predetermined amount of minority charge carriers (e.g., holes) that may be accumulated/stored in the floating gate region 302b of the body region 322 may outnumber the amount of majority charge carriers (e.g., electrons) that may be accumulated/stored in the floating gate region 302b of the body region 322. The predetermined amount of minority charge carriers (e.g., holes) accumulated/stored in the floating gate region 302b of the body region 322 of the memory cell 12 may represent that a logic low (e.g., binary "0" data state) may be stored in the memory cell 12.

The program operation may perform a write logic high (e.g., binary "1" data state) operation by accumulating/storing majority charge carriers (e.g., electrons) in the memory cell 12. During the program operation, the N+ substrate 332 may be coupled to an electrical ground (e.g., 0V), the P+ region 330 may be coupled to an electrical ground (e.g., 0V), and/or the source region 320 may be coupled to an electrical ground (e.g., 0V). The junction between the P+ region 330 and the source region 320 may be reversed biased or weakly forward biased (e.g., above a reverse bias voltage and below a forward bias threshold voltage potential). A selected bit line (CN1) 30 may be coupled to an electrical ground (e.g., 0V), while a positive voltage potential may be applied to the unselected bit line (CN2) 30. In an embodiment, the positive voltage potential applied to the unselected bit line (CN2) 30 may be 7.0V.

A positive voltage potential may be applied to the first select gate (SG) line 234a may turn a select gate transistor (e.g., corresponding to the first floating body region 14(0)) to an "ON" state to provide the majority charge carriers access to the floating body regions 14(0-n). The second select gate (SG) line 234b may be coupled an electrical ground (e.g., 0V). For example, the grounded select gate (SG) line 234b may turn a select gate transistor (e.g., corresponding to the floating body region 14(n)) to an "OFF" state to prevent inadvertent programming of the memory cell 12 via unselected bit lines (CN) 30.

A positive voltage potential may be applied to the plurality of control gate (CG) lines 236(0-n) that may be capacitively coupled to the plurality of floating body region 14(1 . . . n−1) of the body region 322. The positive voltage potential applied to the selected control gate (CG1) line 236(1) may be higher than the voltage potential applied to the unselected control gate (CG) lines 236(0, 2, . . . , n). For example, the positive voltage potential applied to the unselected control gate (CG) lines 236(0, 2, . . . , n) may be sufficient to invert a surface under the unselected control gate (CG) lines 236(0, 2, . . . , n) to provide a path for the majority charge carriers. In an embodiment, the positive voltage potential applied to the selected control gate (CG1) line 236(1) may be approximately 16.0V to 20.0V and the positive voltage potential applied to the unselected control gate (CG) lines 236(0, 2, . . . , n) may be 7.0V. The majority charge carriers (e.g., electrons) may be attracted by the higher voltage potential applied to the selected control gate (CG) line 236(1). The majority charge carriers (e.g., electrons) may flow from the drain region 324 to the floating body region 14(2) that may be capacitively coupled to the selected control gate (CG) line 236(1) via one or more floating body regions (e.g., 14(0) and 14(1)) between the drain region 324 and the floating body region 14(2). The predetermined amount of majority charge carriers (e.g., electrons) tunneled and stored in the selected floating gate region 302b(1) (e.g., the embedded nitride region) of the selected floating body region 14(2) of the body region 322 may represent that a logic high (e.g., binary "1" data state) is stored in the memory cell 12.

A read operation may be performed to read a data state (e.g., a logic low (e.g., binary "0" data state) and/or a logic high (e.g., binary "1" data state)) stored in the memory cell 12. During a read operation, the N+ substrate 332 may be coupled an electrically ground (e.g., 0V), the P+ region 330 may be coupled to an electrical ground (e.g., 0V), and the source region 320 may be coupled to an electrical ground (e.g., 0V). A positive voltage potential may be applied to the drain region 324 of the memory cell 12 via the bit line (CN) 30. In an embodiment, the positive voltage potential applied to the drain region 324 may be 1.0V. A positive voltage potential may be applied to the plurality of select gate (SG) lines 234a-b. In an embodiment, the positive voltage potential applied to the plurality of select gate (SG) lines 234a-b may be 5.0V. The positive voltage potential applied to the plurality of select gate (SG) lines 234a-b may enable the performance of a read operation of a plurality of floating body regions 14 capacitively coupled to the plurality of control gate (CG) lines 236(0-n).

A positive voltage potential may be applied to a plurality of unselected control gate (CG) lines 236 (0, 2, . . . , n). In an embodiment, the positive voltage potential applied to the plurality of unselected control gate (CG) lines 236(0, 2, . . . , n) may be 5.0V. The positive voltage potential applied to the plurality of unselected control gate (CG) lines 236(0, 2, . . . , n) may be sufficient to invert a surface of the floating body regions 14 that may be capacitively coupled to the plurality of unselected control gate (CG) lines 236(0, 2, . . . , n) and the drain region 324. A selected control gate (CG) line 236(1) may be coupled to an electrical ground (e.g., 0V). Under such biasing, the surface of the floating body region 14(2) may be inverted when a small amount of or no majority charge carriers are stored in the floating gate region 302b. Also, under such biasing, the surface of the floating body region 14(2) may not be inverted when a predetermined amount of majority charge carriers are stored in the floating gate region 302b. The majority charge carriers (e.g., electrons) may flow from the selected floating body region 14(2) to the drain region 324. In an embodiment, when a logic high (e.g., binary "1" data state) is stored in the memory cell 12, no voltage potential and/or current may be detected at the drain region 324. In another embodiment, when a logic low (e.g., binary "0" data state) is stored in the memory cell 12, a predetermined amount of voltage potential and/or current may be detected at the drain region 324.

Figure 5:
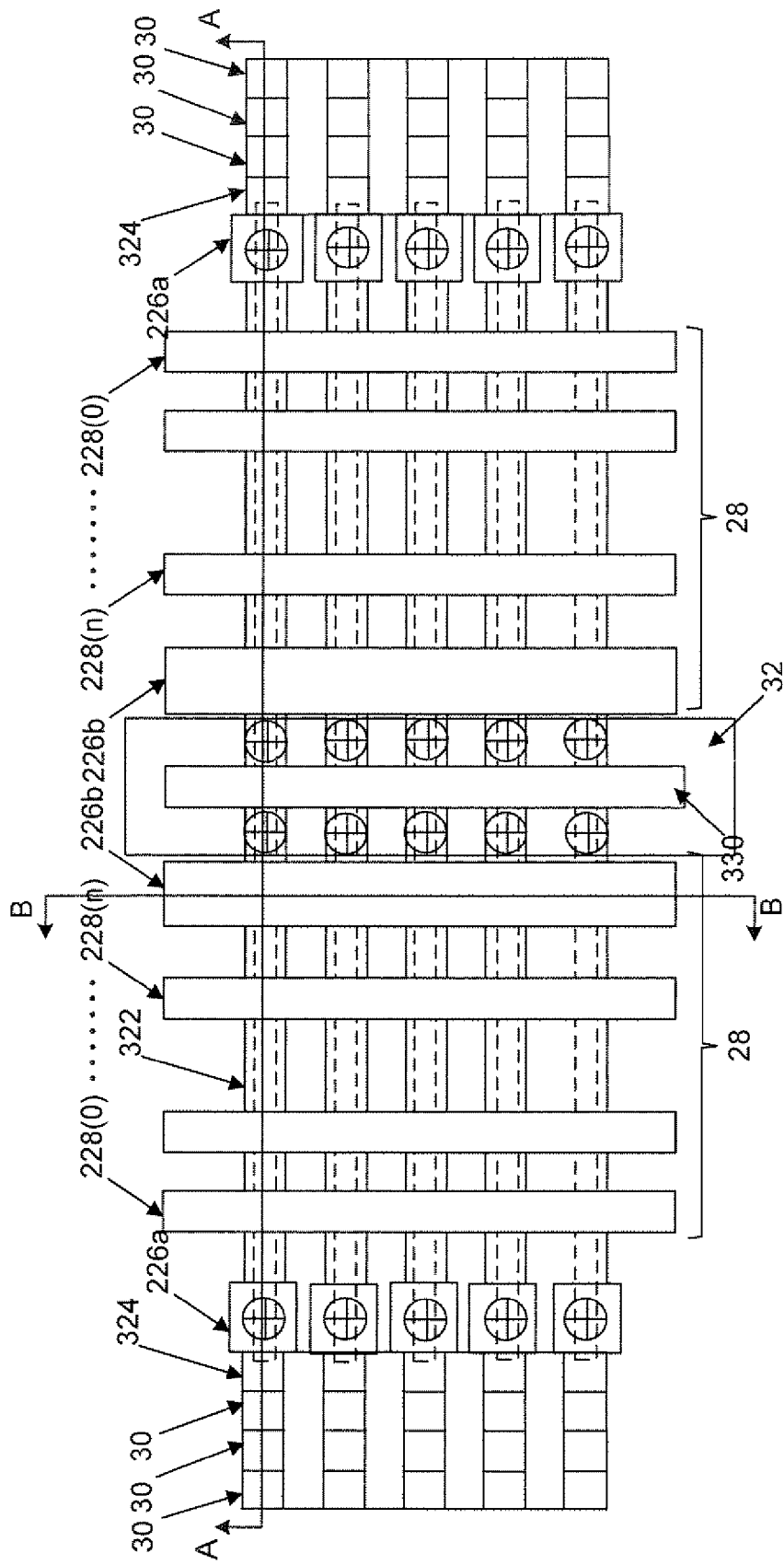
FIG. 5 shows a top view of at least a portion of the memory cell array as shown in FIG. 1 in accordance with an alternate embodiment of the present disclosure.

Referring to FIG. 5, there is shown a top view of at least a portion of the memory cell array 20 as shown in FIG. 1 in accordance with an alternate embodiment of the present disclosure. The at least a portion of the memory cell array 20 as shown in FIG. 5 is similar to the at least a portion of the memory cell array 20 as shown in FIG. 2, except that the memory cells 12 may be implemented in a horizontal configuration. As illustrated in the top view, the memory cell array 20 may include a plurality of memory cells 12 arranged in a matrix of rows and columns including a plurality of word lines (WL), a plurality of bit lines (CN) 30, and/or a source line plate (EN) 32. Each bit line (CN) 30 may extend in a first orientation along a plurality of planes of the memory cell array 20. The source line strip (EN) 32 may extend in a second orientation along a second plane of the memory cell array 20. Each word line (WL) 28 may extend in the second orientation along a third plane of the memory cell array 20. The plurality of planes, the second plane, and the third plane of the memory cell array 20 may be arranged in different planes parallel to each other.

The plurality of word lines (WL) 28 may be formed of a polycide material (e.g., a combination of a metal material and a silicon material), a metal material, and/or a combination of a polycide material and a metal material. In an embodiment, the word lines (WL) 28 may capacitively couple a voltage potential/current source of the memory cell selection and control circuitry 38 to the memory cells 12. The word line (WL) 28 may be formed of a plurality layers. Each layer of the word line (WL) 28 may be formed of different materials. In an embodiment, the first layer of the word line (WL) 28 may be formed of a silicon material and the second layer of the word line (WL) 28 may be formed of a metal material.

The plurality of word lines (WL) 28 may comprise a plurality of gate lines. The plurality of gate lines may include a plurality of select gate (SG) lines 234 (not shown) and a plurality of control gate (CG) lines 236 (not shown). In an embodiment, the plurality of word lines (WL) 28 may comprise at least two select gate lines 234a-b. The plurality of word lines (WL) 28 may also comprise a predetermined number of control gate (CG) lines 236(0-n). Each of the plurality of select gate (SG) lines 234a-b may be coupled to a corresponding select gate (SG) line contact 226. Each of the plurality of control gate (CG) lines 236(0-n) may be coupled to a corresponding control gate (CG) line contact 228(0-n).

The plurality of control gate (CG) line contacts 228(0-n) may be arranged between the plurality of select gate (SG) contacts 226a-b. The plurality of select gate (SG) line contacts 226a-b and the plurality of control gate (CG) line contacts 228(0-n) may be arranged in the same plane. The plurality of select gate (SG) line contacts 226 and the plurality of control gate (CG) line contacts 228 may be arranged above the memory cell array 20.

Figure 6:
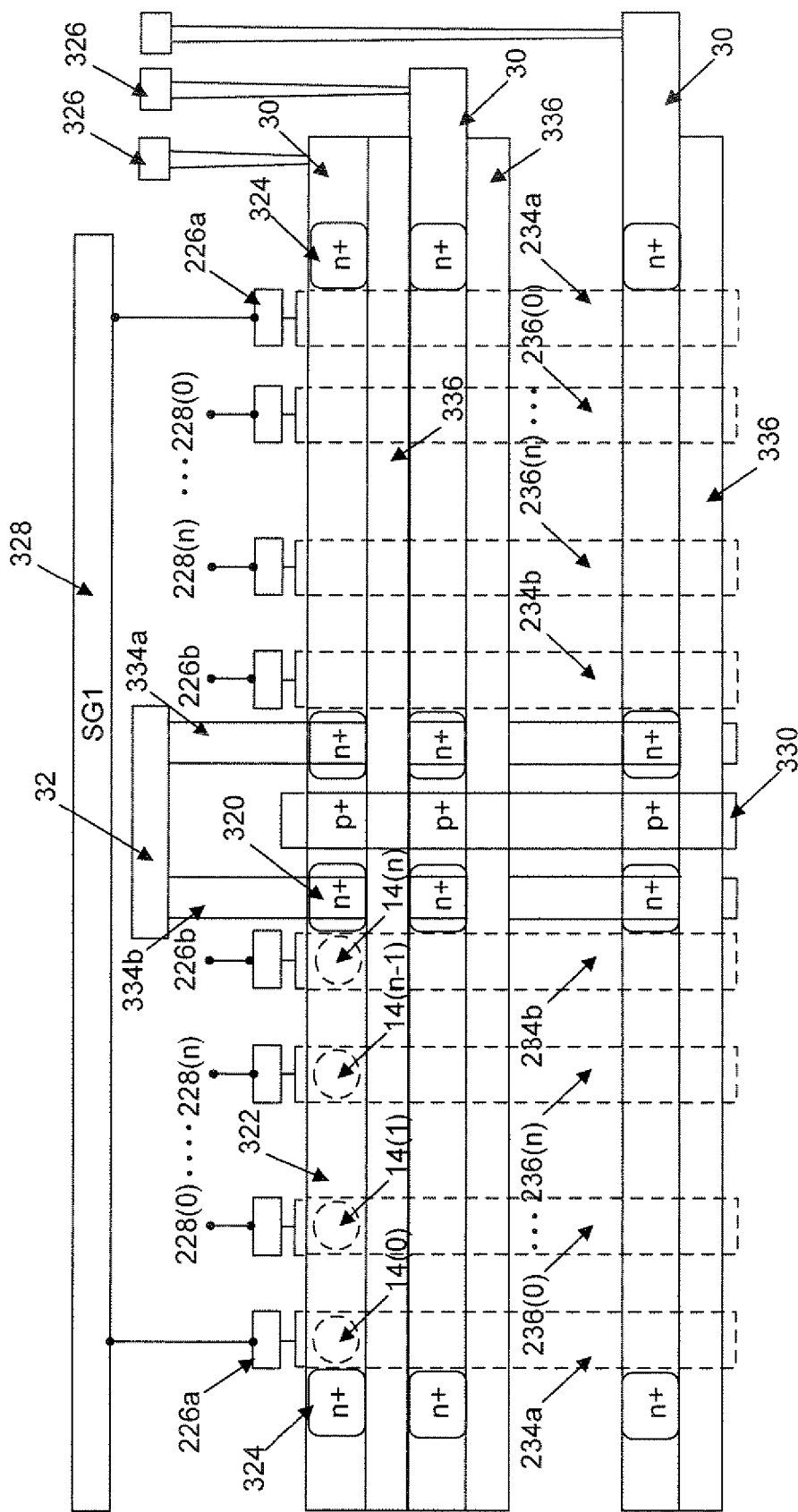
FIG. 6 shows a cross-sectional view along line A-A of at least a portion of the memory cell array as shown in FIG. 5 in accordance with an embodiment of the present disclosure.

Referring to FIG. 6, there is shown a cross-sectional view along line A-A of at least a portion of the memory cell array 20 as shown in FIG. 5 in accordance with an embodiment of the present disclosure. The memory cells 12 of the memory cell array 20 may be implemented in a horizontal configuration having various regions. For example, the memory cell 12 may comprise a source region 320, a body region 322, and a drain region 324. The source region 320, the body region 322, and/or the drain region 324 may be disposed in a sequential contiguous relationship, and may extend horizontally from a plane defined by a bit line (CN) 30. The source region 320 of the memory cell 12 may be coupled to the source line (EN) 32. The body region 322 may be an electrically floating body region of the memory cell 12 configured to accumulate/store charges, and may be spaced apart from and capacitively coupled to the plurality of word lines (WL) 28. The drain region 324 of the memory cell 12 may be coupled to the bit line (CN) 30.

The source region 320 of the memory cell 12 may be coupled to a corresponding source line (EN) 32. In an embodiment, the source region 320 may be formed of a semiconductor material (e.g., silicon) comprising donor impurities. For example, the source region 320 may be formed of a silicon material doped with phosphorous or arsenic impurities. In an embodiment, the source region 320 may be formed of a silicon material doped with phosphorous or arsenic having a concentration of approximately $10^{20}$ atoms/cm$^3$ or above.

In an embodiment, the source line (EN) 32 may be formed of an doped silicon layer. In another embodiment, the source line (EN) 32 may be formed of a metal material. In other embodiments, the source line (EN) 32 may be formed of a polycide material (e.g., a combination of a metal material and a silicon material). The source line (EN) 32 may couple a predetermined voltage potential to the memory cells 12 of the memory cell array 20. For example, the source line (EN) 32 may be coupled to a plurality of memory cells 12 (e.g., a column or a row of memory cell array 20).

The source line (EN) 32 may be coupled to a plurality columns of memory cells 12 of the memory cell array 20 via a plurality of source line (EN) contacts 334a-b. In an embodiment, the source line (EN) 32 may be coupled to the source regions 320 of the plurality columns of memory cells 12 of the memory cell array 20 via the plurality of source line (EN) contacts 334a-b. The source line (EN) 32 may include a plurality of source line (EN) contacts 334a-b. Each of the source line (EN) contacts 334a-b may be coupled to a disparate column of memory cells 12 of the memory cell array 20. The source line (EN) 32 may be coupled to two contiguous columns of memory cells 12 of the memory cell array 20 via the plurality of source line (EN) contacts 334a-b. For example, the first source line (EN) contact 334a may be coupled to the source region 320 of the first column of memory cells 12 of the memory cell array 20. The second source line (EN) contact 334b may be coupled to the source region 324 of the second column of memory cells 12 of the memory cell array 20. The plurality of source line (EN) contacts 334a-b may have a height extending from the source line (EN) 32 to the plurality of source regions 320 of the memory cells 12 in a column of the memory cell array 20.

The plurality of source line (EN) contacts 334a-b may be formed of a metal layer or a polysilicon layer in order to couple a voltage potential from the source line (EN) 32 to the source region 320 of the memory cell 12. For example, the plurality of source line (EN) contacts 334a-b may be formed of tungsten, titanium, titanium nitride, polysilicon or combination thereof.

The body region 322 of the memory cell 12 may be capacitively coupled to a corresponding word line (WL) 28. In an embodiment, the body region 322 may be formed of undoped semiconductor material (e.g., intrinsic silicon). In another embodiment, the body region 322 may be formed of a semiconductor material (e.g., silicon) comprising acceptor impurities. For example, the body region 322 may be formed of a silicon material doped with boron impurities. The body region 322 may be formed of a silicon material with acceptor impurities having a concentration of $10^{15}$ atoms/cm$^3$.

The body region 322 may comprise a plurality of floating body regions 14(0-n) and a plurality of corresponding floating gate regions 302b(0-n). For example, charge carriers may be accumulated/stored in the plurality of floating gate regions 302b(0-n) corresponding to the plurality of floating body region 14(0-n) in order to represent a data state (e.g., a logic low (e.g., binary "0" data state) and/or a logic high (e.g., binary "1" data state)). Each of the plurality of floating body regions 14(0-n) may be capacitively coupled to a corresponding select gate (SG) line 234 or a corresponding control gate (CG) line 236. In an embodiment, a first floating body region 14(0) may be capacitively coupled to a corresponding first select gate (SG) line 234a. The last floating body region 14(n) may be capacitively coupled to a corresponding second select gate (SG) line 234b. One or more intervening floating body region 14(1, . . . , n-1) may be capacitively coupled to the plurality of control gate (CG) lines 236(0-n). The plurality of floating body regions 14(0-n) may be accessible via the first select gate (SG) line 234a and/or the second select gate (SG) line 234b.

As discussed above, the plurality of word lines (WL) 28 may comprise a plurality of select gate (SG) lines 234 and/or a plurality of control gate (CG) lines 236. The plurality of select gate (SG) lines 234 and the plurality of control gate (CG) lines 236 may be arranged in a sequential contiguous relationship extending in a vertical direction of the body region 322. The plurality of select gate (SG) lines 234 and the plurality of control gate (CG) lines 236 may be capacitively coupled to a plurality of floating body regions 14 in the column direction of the memory cell array 20. For example, the plurality of control gate (CG) lines 236(0-n) may be arranged between the plurality of select gate (SG) lines 234a-b. In an embodiment, the first select gate (SG) lines 234a may be arranged contiguous to the source region 320 and the second select gate (SG) lines 234b may be arranged contiguous to the drain region 324. The plurality of control gate (CG) lines 236(0-n) may be arranged between the first select gate (SG) lines 234a and the second select gate (SG) lines 234b.

The plurality of select gate (SG) lines 234 may be coupled to the plurality of select gate (SG) line contacts 226 and the plurality of control gate (CG) lines 236 may be coupled to the plurality of control gate (CG) line contacts 228. The select gate (SG) line contacts 226 may be formed of a metal layer or a polysilicon layer in order to couple a voltage potential and/or current to the select gate (SG) lines 234. The control gate (CG) line contacts 228 may be formed of a metal layer or a polysilicon layer in order to couple a voltage potential and/or current to the control gate (CG) lines 236. For example, the select gate (SG) line contacts 226 and the control gate (CG) line contact 228 may be formed of tungsten, titanium, titanium nitride, polysilicon or a combination thereof. The select gate (SG) line contacts 226 may have a height extending down to the select gate (SG) lines 234. The control gate (CG) line contact 228 may have a height extending down to the control gate (CG) lines 236.

A plurality of select gate (SG) line contacts 226 may be coupled to each other in order to simultaneously access a plurality of memory cells 12. For example, a plurality of first select gate (SG) line contacts 226a may be coupled to each other via a select gate (SG) coupling contact 328. In another embodiment, a plurality of second select gate (SG) line contacts 226b may be coupled to each other via the select gate (SG) coupling contact 328. The select gate (SG) coupling contact 328 may be formed of tungsten, titanium, titanium nitride, polysilicon or a combination thereof.

The drain region 324 of the memory cell 12 may be coupled to a corresponding bit line (CN) 30. In an embodiment, the drain region 324 of the memory cell 12 may be formed of a semiconductor material (e.g., silicon) comprising donor impurities. For example, the drain region 324 may be formed of a silicon material doped with phosphorous or arsenic impurities. In an embodiment, the drain region 324 may be formed of a silicon material doped with phosphorous or arsenic having a concentration of approximately $10^{20}$ atoms/cm$^3$ or above.

The bit line (CN) 30 may be coupled to the drain region 324 of the memory cell 12. The bit line (CN) 30 may be formed of a metal material. In another embodiment, the bit line (CN) 30 may be formed of a polycide material (e.g., a combination of a metal material and a silicon material). In other embodiments, the bit line (CN) 30 may be formed of an N+ doped silicon layer. For example, the bit line (CN) 30 may be coupled to a plurality of memory cells 12. The bit line (CN) 30 may be configured on one or more side portions of the drain region 324.

The plurality of bit lines (CN) 30 may have different length in order to make contact with the plurality of bit line (CN) contacts 326. The length of the plurality of bit lines (CN) 30 may be based at least in part on a location of the bit lines (CN) 30. For example, a first bit line (CN) line 30 may have a length shorter than a second bit line (CN) 30 that is located below the first bit line (CN) 30. In an embodiment, the first bit line (CN) 30 may have a length shorter than the second bit line 30. The second bit line (CN) 30 may have a length shorter than the third bit line 30, etc. Finally, the last bit line (CN) 30 may have the longest length of the plurality of bit lines (CN) 30.

The plurality of bit line (CN) contacts 326 may have different lengths in order to couple to the plurality of bit line (CN). The plurality of bit line (CN) contacts 326 may have a length based at least in part on the length of the bit line (CN) 30. For example, a shorter bit line (CN) contact 326 may be coupled to a short bit line (CN) 30, while a longer bit line (CN) contact 326 may be coupled to a longer bit line (CN) 30. In an embodiment, the shortest bit line (CN) contact 326 may be coupled to the shortest bit line (CN) 30 and the longest bit line (CN) contact 326 may be coupled to the longest bit line (CN) 30. Each bit line contact 326 may be formed of a metal layer or a polysilicon layer in order to couple a voltage potential from the bit line (CN) 30 to the drain region 324 of the memory cell 12. For example, the bit line contact 326 may be formed of tungsten, titanium, titanium nitride, polysilicon or a combination thereof. The bit line contact 326 may have a height extending from the bit line (CN) 30 to the drain region 324 of the memory cell 12.

An insulating or dielectric layer 336 may be disposed between the plurality of bit lines (CN) 30. The insulating or dielectric layer 336 may provide an electrical insulation between adjacent bit lines (CN) 30. For example, the insulating or dielectric layer 336 may be formed from an oxide layer or a thermal oxide layer. The insulating or dielectric layer 336 may have a predetermined thickness in order to electrically insulating adjacent bit lines (CN) 30.

In an embodiment, the P+ region 330 may be made of a semiconductor material (e.g., silicon) comprising acceptor impurities and may be disposed between two contiguous columns of memory cells 12. For example, the P+ region 330 may be made of a semiconductor material comprising acceptor impurities. In an embodiment, the P+ region 330 may be made of silicon comprising boron impurities having a concentration of approximately $10^{20}$ atoms/cm$^3$ or above. The P+ region 330 may be disposed between two contiguous columns of memory cells 12 and may be shared between the two contiguous columns of memory cells 12. The P+ region 330 may be formed of an elongated strip region to be shared between two contiguous columns of memory cells 12. In an embodiment, the P+ region 330 may provide minority charge carriers (e.g., holes) to the two contiguous columns of memory cells 12 during one or more operations. The P+ region 330 may be also disposed between the plurality of source line (EN) contacts 334*a-b*.

Figure 7:
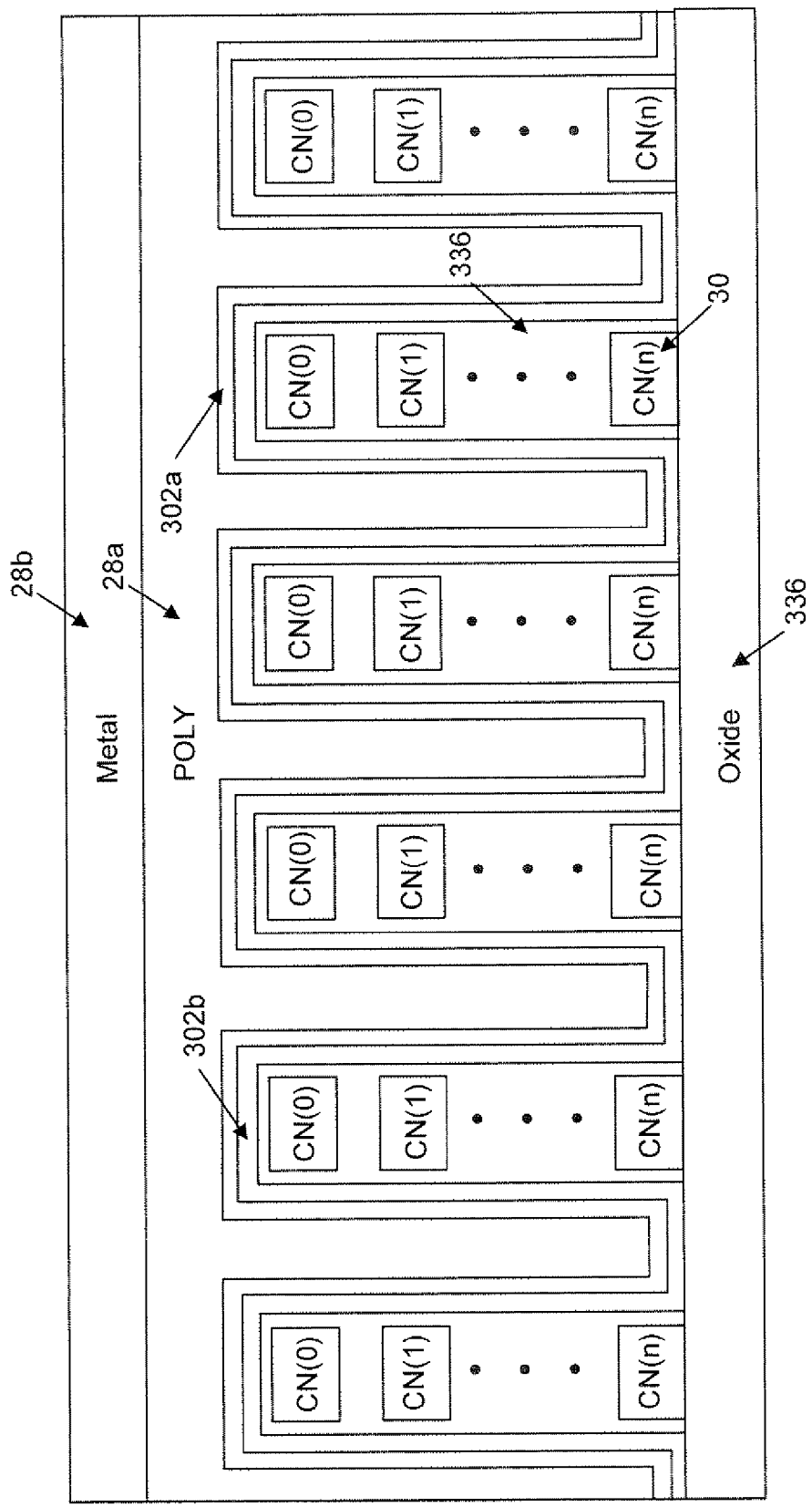
FIG. 7 shows a cross-sectional view along line B-B of at least a portion of the memory cell array as shown in FIG. 5 in accordance with an embodiment of the present disclosure.

Referring to FIG. 7, there is shown a cross-sectional view along line B-B of at least a portion of the memory cell array 20 as shown in FIG. 5 in accordance with an embodiment of the present disclosure. As discussed above, a plurality of bit lines (CN(0-n)) 30 may be coupled to a plurality of memory cells (e.g., a row of memory cell array 20). The oxide layer 336 may form the base of the memory cell array 20. In an embodiment, a plurality of oxide layer 336 may form the base of the memory cell array 20. In another embodiment, a single oxide layer 336 may form the base of the memory cell array 20. The oxide layer 336 may be disposed between the plurality of bit line (CN(0-n)) 30.

The word line (WL) 28 may be capacitively coupled to the body region 322 of the memory cell 12 via a floating gate region 302. The floating gate region 302 may be formed above the plurality of bit lines (CN(0-n)) 30. In an embodiment, the floating gate region 302 may cover the plurality of bit lines (CN(0-n)) 30 and the oxide layer 336 disposed between the plurality of bit lines (CN(0-n)) 30. The floating gate region 302 may comprise a plurality of layers formed of different material. In an embodiment, the floating gate region 302 may comprise a first layer 302*a* and a second layer 302*b* formed of different material. The first layer 302*a* of the floating gate region 302 may be formed of an oxide material and/or a thermal oxide material. The second layer 302*b* of the floating gate region 302 may be formed of a nitride material. The first layer 302*a* of the floating gate region 302 may overlap and cover the second layer 302*b* of the floating gate region 302.

The plurality of word lines (WL) 28 may comprise a plurality of layers. For example, the word line (WL) 28 may comprise two layers formed of different material. In an embodiment, the first layer 28*a* of the word line (WL) 28 may be formed of a polysilicon material. The second layer 28*b* of the word line (WL) 28 may be formed of a metal material. The first layer 28*a* of the word line (WL) 28 may overlap and cover the floating body region 302 and the second layer 28*b* of the word line (WL) 28 may be disposed above the first layer 28*a* of the word line (WL) 28.

Figure 8:
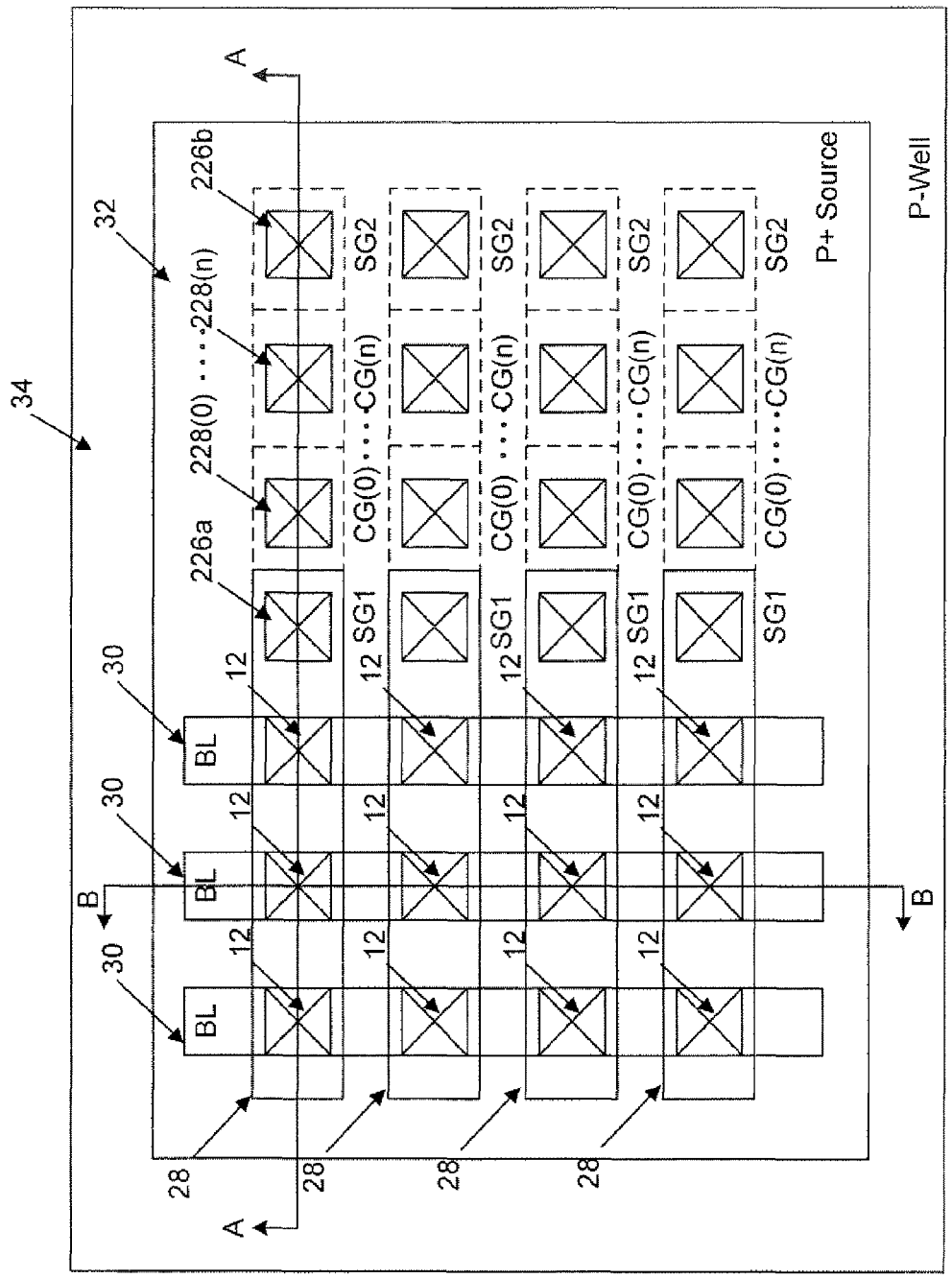
FIG. 8 shows a top view of at least a portion of the memory cell array 20 shown in FIG. 1 in accordance with an alternate embodiment of the present disclosure.

Referring to FIG. 8, there is shown a top view of at least a portion of the memory cell array 20 shown in FIG. 1 in accordance with an alternate embodiment of the present disclosure. The at least a portion of the memory cell array 20 as shown in FIG. 8 may be similar to the at least a portion of the memory cell array 20 as shown in FIG. 2, except that the source line plate (EN) 32 may be formed of P-type semiconductor material.

Figure 9:
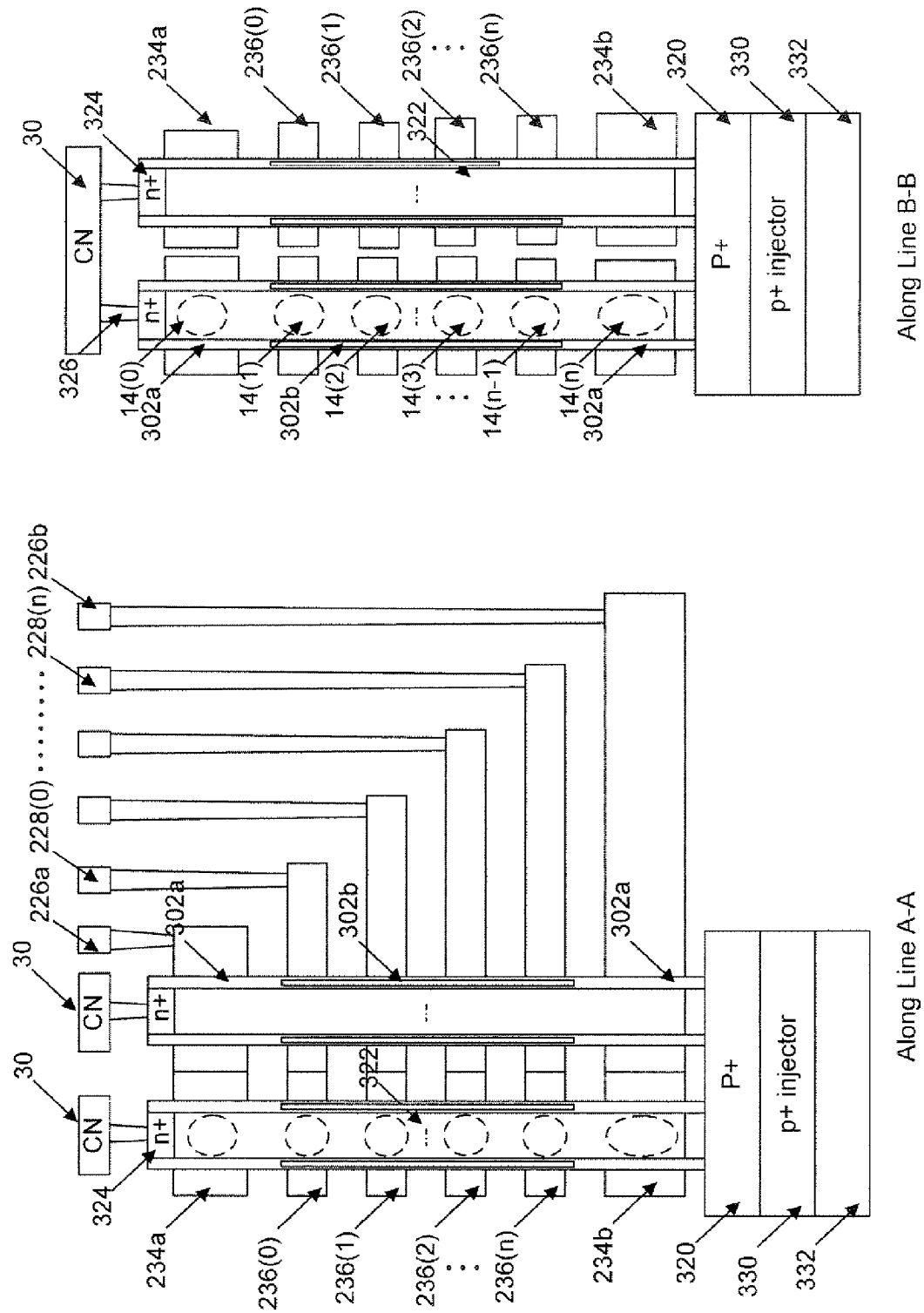
FIG. 9 shows cross-sectional views of at least a portion of the memory cell array as shown in FIG. 8 in accordance with an embodiment of the present disclosure.

Referring to FIG. 9, there are shown cross-sectional views of at least a portion of the memory cell array 20 as shown in FIG. 8 in accordance with an embodiment of the present disclosure. FIG. 9 illustrates a cross-sectional view of at least a portion of the memory cell array 20 along line A-A and a cross-sectional view of at least a portion of the memory cell array 20 along line B-B. The sectional views as shown in FIG. 9 may be similar to the sectional views as shown in FIG. 3, except that the source region 320 may be made of P-type semiconductor material. The source region 320 of the memory cell 12 may be coupled to a corresponding source line (EN) 32. In an embodiment, the source region 320 may be formed of a semiconductor material (e.g., silicon) comprising acceptor impurities. For example, the source region 320 may be formed of a silicon material doped with boron impurities. In an embodiment, the source region 320 may be formed of a silicon material doped with boron having a concentration of approximately $10^{20}$ atoms/cm$^3$ or above. The source region 320 may comprise a plate having continuous planar region configured above the P+ region 330 and/or the N+ substrate 332. The source region 320 may also comprise a plurality of protrusions formed on the continuous planar region of the plate. The plurality of protrusions of the source region 320 may be oriented in a column direction and/or a row direction of the memory cell array 20. The plurality of protrusions of the source region 320 may form the base of the memory cell 12.

Referring to FIG. 10, there is shown voltage potential levels of various methods for performing a write operation and a read operation on a memory cell 12 as shown in FIGS. 7-9 in accordance with an embodiment of the present disclosure. The write operation may include a write logic low (e.g., binary "0" data state) operation and a write logic high (e.g., binary "1" data state) operation. In an embodiment, the various methods of performing a write logic low (e.g., binary "0" data state) operation may be accomplished via an erase operation. In another embodiment, the various methods of performing a write logic high (e.g., binary "1" data state) operation may be accomplished via a program operation.

The erase operation may perform a write logic low (e.g., binary "0" data state) operation by accumulate/store minority charge carriers (e.g., holes) in order to compensate for the majority charge carriers (e.g., electrons) that may have accumulated/stored in the memory cell 12. During the erase operation, a positive voltage potential may be applied to the N+ substrate 332. In an embodiment, 1.0V may be applied the N+ substrate 332. A positive voltage potential may be applied to the P+ region 330 and the source region 320. The same positive voltage potentials may be applied to the P+ region 330 and the source region 320. In an embodiment, the positive voltage potential applied to the P+ region 330 and the source region 320 may be 1.0V. The plurality of bit lines (CN) 30 may be decoupled from a voltage potential source and/or current source and may be electrical open or electrically floating.

A plurality of negative voltage potentials may be applied to the plurality of select gate (SG) lines 234 (e.g., that may be capacitively coupled to plurality floating body regions 14 of the body region 322). The negative voltage potential applied to the select gate (SG) lines 234*b* may forward bias the junction between the source region 320 and the floating body region 14(n) of the body region 322. In an embodiment, the plurality of negative voltage potentials applied to the select gate (SG) lines 234 may be −5.0V. Simultaneously to or after forward biasing the junction between the floating body region 14(n) and the source region 320, a plurality of negative voltage potentials may be applied to the plurality of control gate (CG) lines 236 (e.g., that may be capacitively coupled to the plurality of floating body regions 14 of the body region 322). In an embodiment, the negative voltage potentials applied to the plurality of control gate (CG) lines 236 may be approximately −16.0V to −20.0V. The negative voltage potential applied to the plurality of word lines (WL) 28 may attract minority charge carriers (e.g., holes) to accumulate/store in the body region 322 via the forward biased junction between the source region 320 and floating body region 14(n) of the body region 322. A predetermined amount of minority charge carriers (e.g., holes) that may be tunneled into the floating gate region 302b or a predetermined amount of majority charge carriers (e.g., electrons) may be tunneled back into the body region 322. The predetermine amount of minority charge carriers (e.g., holes) accumulated/stored in the floating gate region 302b of the memory cell 12 may represent that a logic low (e.g., binary "0" data state) may be stored in the memory cell 12.

The program operation may perform a write logic high (e.g., binary "1" data state) operation by accumulating/storing majority charge carriers (e.g., electrons) in the memory cell 12. During the program operation, the N+ substrate 332 may be coupled to an electrical ground (e.g., 0V), the P+ region 330 may be coupled to an electrical ground (e.g., 0V), and/or the source region 320 may be coupled to an electrical ground (e.g., 0V). The junction between the P+ region 330 and the source region 320 may be reversed biased or weakly forward biased (e.g., above a reverse bias voltage and below a forward bias threshold voltage potential). A selected bit line (CN1) 30 may be coupled to an electrical ground (e.g., 0V), while a positive voltage potential may be applied to the unselected bit line (CN2) 30. In an embodiment, the positive voltage potential applied to the unselected bit line (CN2) 30 may be 5.0V (e.g., Vdd).

A positive voltage potential may be applied to the first select gate (SG) line 234a that may be capacitively coupled to the first floating body region 14(0) of the body region 322. Also, a positive voltage potential may be applied to the second select gate (SG) lines 234b that may be capacitively coupled to the last floating body region 14(n) of the body region 322. In an embodiment, the positive voltage potential applied to the first select gate (SG) line 234a may be approximately 5.0V. In another embodiment, the positive voltage potential applied to the second select gate (SG) line 234b may be approximately 5.0V. The positive voltage potential applied to the first select gate (SG) line 234a may turn a select gate transistor (e.g., corresponding to the first floating body region 14(0)) to an "ON" state to couple the drain region 324 to the floating body regions 14(0-n). The positive voltage potential applied to the second select gate (SG) line 234b may turn a select gate transistor (e.g., corresponding to the floating body region 14(n)) to an "OFF" state to decouple the source region 320. A predetermined amount of majority charge carrier (e.g., electrons) may be injected into the first floating body region 14(0) of the body region 322.

A positive voltage potential may be applied to the plurality of control gate (CG) lines 236(0-n) that may be capacitively coupled to the plurality of floating body region 14(1, . . . , n-1) of the body region 322. The positive voltage potential applied to the selected control gate (CG1) line 236(1) may be higher than the voltage potential applied to the unselected control gate (CG) lines 236(0, 2, . . . , n). In an embodiment, the positive voltage potential applied to the selected control gate (CG1) line 236(1) may be approximately 16.0V to 20.0V and the positive voltage potential applied to the unselected control gate (CG) lines 236(0, 2, . . . , n) may be 7.0V. The majority charge carriers (e.g., electrons) may be attracted by the higher voltage potential applied to the selected control gate (CG) line 236(1). The majority charge carriers (e.g., electrons) may flow from the drain region 324 to the floating body region 14(2) that may be capacitively coupled to the selected control gate (CG) line 236(1) via one or more floating body regions (e.g., 14(0) and 14(1)) between the drain region 324 and the floating body region 14(2). The predetermined amount of majority charge carriers (e.g., electrons) tunneled from the selected floating body region 14(2) into the floating gate region 302b may represent that a logic high (e.g., binary "1" data state) is stored in the memory cell 12.

A read operation may be performed to read a data state (e.g., a logic low (e.g., binary "0" data state) and/or a logic high (e.g., binary "1" data state)) stored in the memory cell 12. During a read operation, a plurality of positive voltage potentials may be applied to the N+ substrate 332, the P+ region 330, and/or the source region 320. In an embodiment, the positive voltage potential applied to the N+ substrate 332 may be 1.0V, the positive voltage potential applied to the P+ region 330 may be 1.0V, and the positive voltage potential applied to the source region 320 may be 1.0V. The drain region 324 may be coupled to an electrical ground (e.g., 0V) via the bit line (CN) 30. A positive voltage potential may be applied to the plurality of select gate (SG) lines 234a-b. In an embodiment, the positive voltage potential applied to the plurality of select gate (SG) lines 234a-b may be 5.0V. The positive voltage potential applied to the plurality of select gate (SG) lines 234a-b may enable the performance of a read operation of a plurality of floating body regions 14 that may be capacitively coupled to the plurality of control gate (CG) lines 236(0-n).

A positive voltage potential may be applied to a plurality of unselected control gate (CG) lines 236(0, 2, . . . , n). In an embodiment, the positive voltage potential applied to the plurality of unselected control gate (CG) lines 236(0, 2, . . . , n) may be 5.0V. The positive voltage potential applied to the plurality of unselected control gate (CG) lines 236(0, 2, . . . , n) may invert a surface of floating body regions 14 that may be capacitively coupled to the plurality of unselected control gate (CG) lines 236(0, 2, . . . , n). A selected control gate (CG) line 236(1) may be coupled to an electrical ground (e.g., 0V). Under such biasing, the selected floating body region 14(2) that may be capacitively coupled to the selected control gate (CG) line 236(1) may turn to an "ON" state based at least in part on an amount of charge carriers stored in the floating gate region 302b. The majority charge carriers (e.g., electrons) may flow through the selected floating body region 14(2) from the drain region 324. Similar, the minority charge carriers (e.g., holes) may flow through the selected floating body region 14(2) from the source region 320. In an embodiment, when a logic high (e.g., binary "1" data state) is stored in the memory cell 12, no voltage potential and/or current may be detected at the drain region 324. In another embodiment, when a logic low (e.g., binary "0" data state) is stored in the memory cell 12, a predetermined amount of voltage potential and/or current may be detected at the drain region 324.

Figure 11:
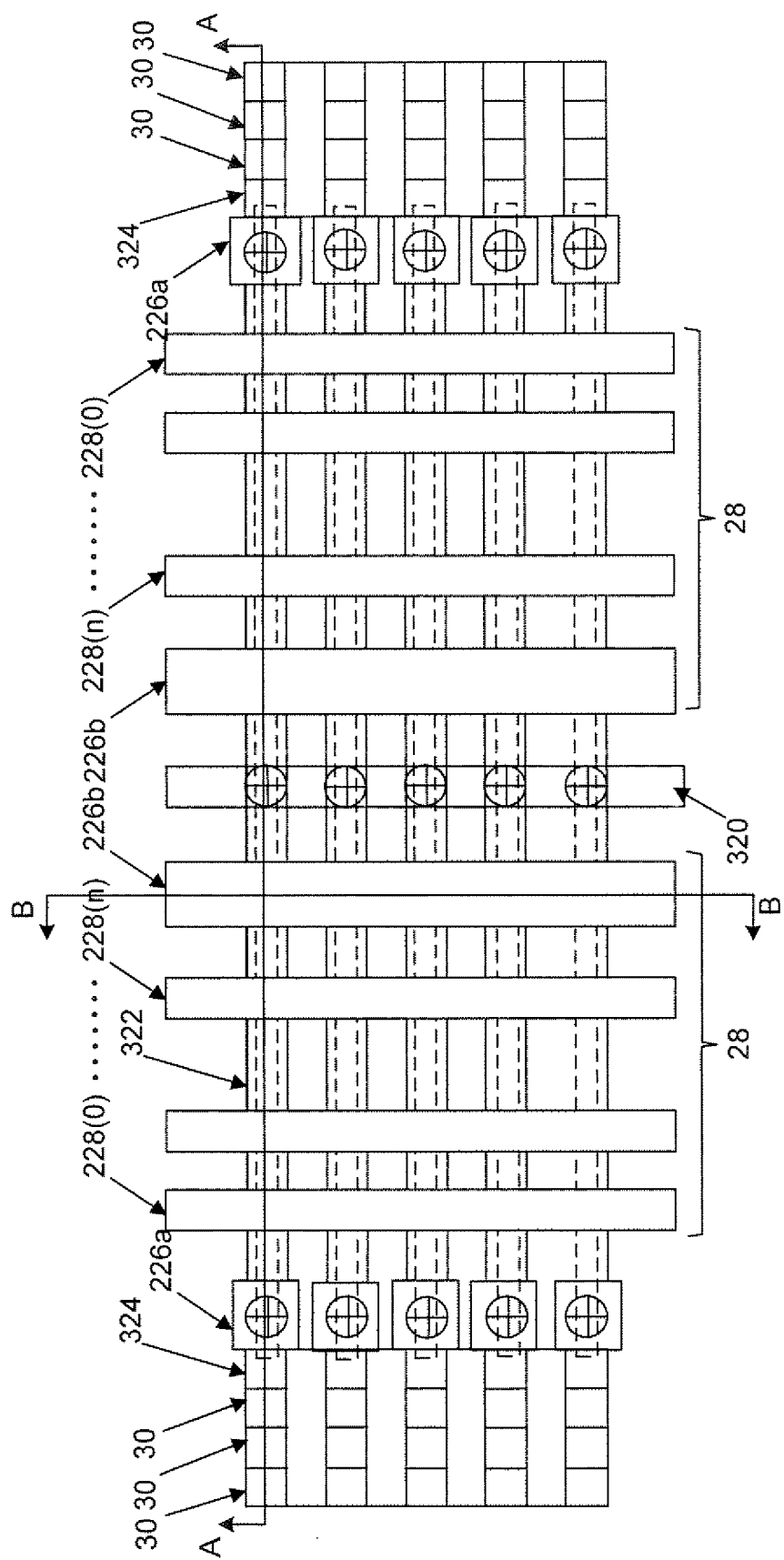
FIG. 11 shows a top view of at least a portion of the memory cell array as shown in FIG. 1 in accordance with an alternate embodiment of the present disclosure.

Referring to FIG. 11, there is shown a top view of at least a portion of the memory cell array 20 as shown in FIG. 1 in accordance with an alternate embodiment of the present disclosure. The at least a portion of the memory cell array 20 as shown in FIG. 11 is similar to the at least a portion of the memory cell array 20 as shown in FIG. 5, except that the source region 320 may be formed of a P-type semiconductor material. Also, the P+ region 330 as shown in FIG. 5, may be eliminated because the source region 320 may be formed of a P-type semiconductor material. The source region 320 may be disposed between adjacent columns of memory cells 12 of the memory cell array 20. In an embodiment, the source region 320 may be disposed between two contiguous columns of memory cells 12 of the memory cell array 20. The single source region 320 disposed between two contiguous columns of memory cells 12 may be the source region 320 for the memory cells 12 of the two contiguous columns of the memory cell array 20.

Figure 12:
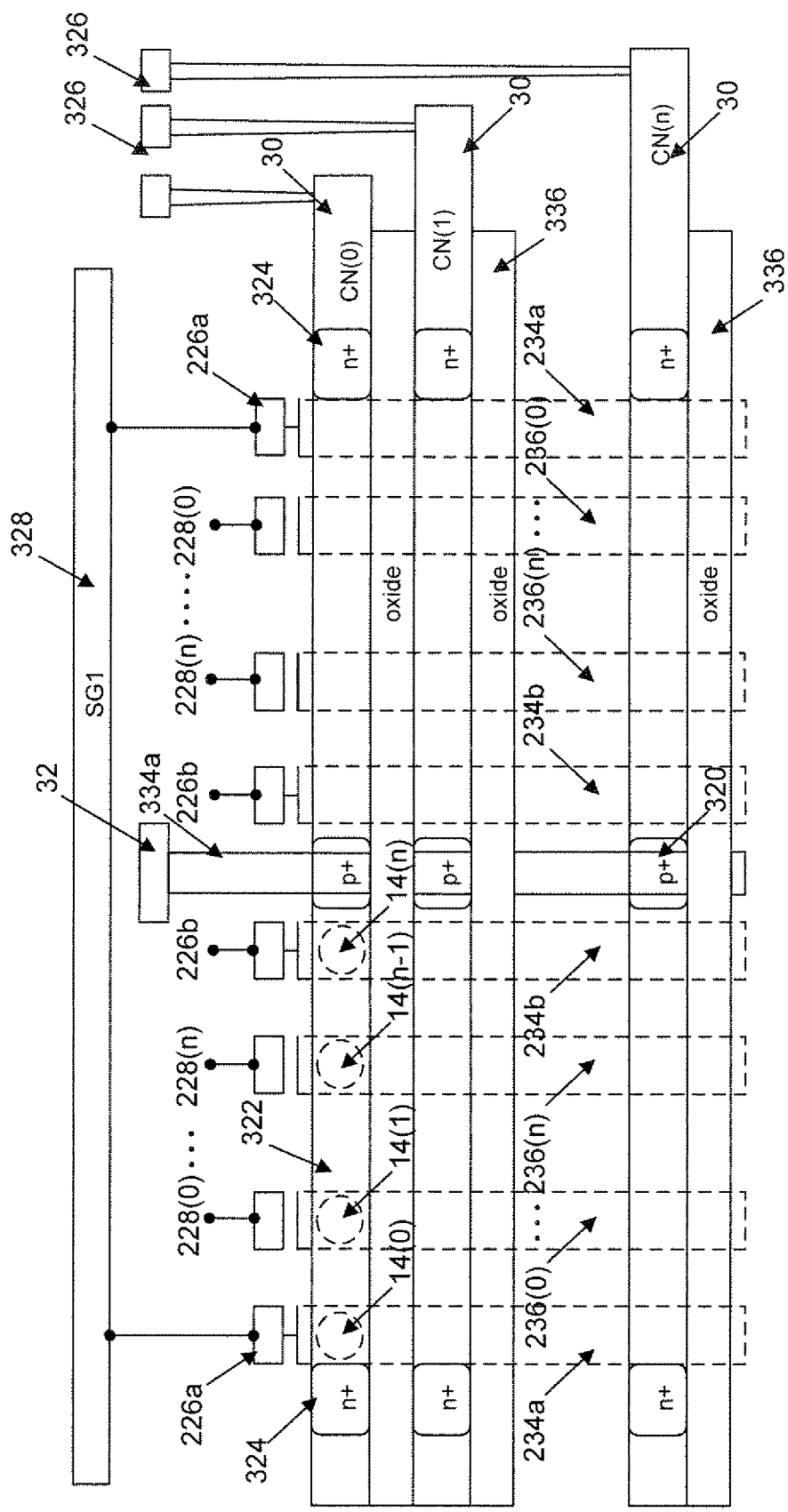
FIG. 12 shows a cross-sectional view along line A-A of at least a portion of the memory cell array as shown in FIG. 11 in accordance with an embodiment of the present disclosure.

Referring to FIG. 12, there is shown a cross-sectional view along line A-A of at least a portion of the memory cell array 20 as shown in FIG. 11 in accordance with an embodiment of the present disclosure. The cross-sectional view as shown in FIG. 12 may be similar to the cross-sectional view as shown in FIG. 6, except that the source region 320 may be made from a P-type semiconductor material. The source region 320 of the memory cell 12 may be coupled to a corresponding source line (EN) 32. In an embodiment, the source region 320 may be formed of a semiconductor material (e.g., silicon) comprising acceptor impurities. For example, the source region 320 may be formed of a silicon material doped with boron impurities. In an embodiment, the source region 320 may be formed of a silicon material doped with boron having a concentration of approximately $10^{20}$ atoms/cm$^3$ or above.

In an embodiment, the source line (EN) 32 may be formed of a metal material. In another embodiment, the source line (EN) may be formed of a P+ doped silicon layer. In other embodiments, the source line (EN) 32 may be formed of a polycide material (e.g., a combination of a metal material and a silicon material). The source line (EN) 32 may couple a predetermined voltage potential to the memory cells 12 of the memory cell array 20. For example, the source line (EN) 32 may be coupled to a plurality of memory cells 12 (e.g., a column or a row of memory cell array 20). The source region 320 may be formed of an elongated strip region to be shared between two contiguous columns of memory cells 12. In an embodiment, the source region 320 may provide minority charge carriers (e.g., holes) to the two contiguous columns of memory cells 12 during one or more operations.

The source line (EN) 32 may be coupled to a plurality columns of memory cells 12 of the memory cell array 20 via a source line (EN) contact 334. In an embodiment, the source line (EN) 32 may be coupled to the source regions 320 of the plurality columns of memory cells 12 of the memory cell array 20 via the source line (EN) contact 334. The source line (EN) contact 334 may be coupled to a plurality columns of memory cells 12 of the memory cell array 20. The source line (EN) 32 may be coupled to the two contiguous columns of memory cells 12 of the memory cell array 20 via the source line (EN) contact 334. The source line (EN) contact 334 may have a height extending from the source line (EN) 32 to the plurality of source regions 320 of the memory cells 12 in a column of the memory cell array 20.

The source line (EN) contact 334 may be formed of a metal layer or a polysilicon layer in order to couple a voltage potential from the source line (EN) 32 to the source region 320 of the memory cell 12. For example, the source line (EN) contact 334 may be formed of tungsten, titanium, titanium nitride, polysilicon or a combination thereof.

Figure 13:
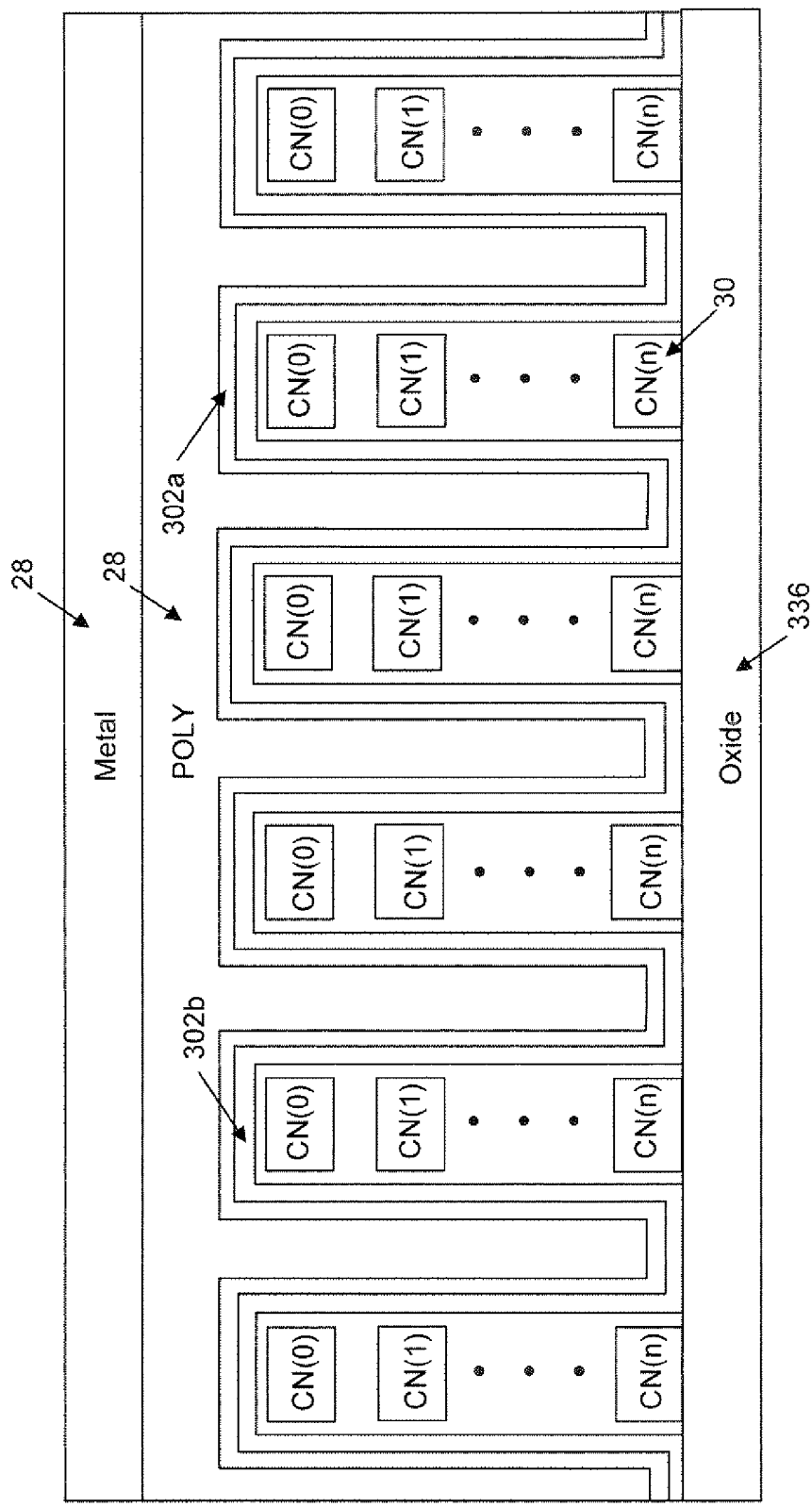
FIG. 13 shows a cross-sectional view along line B-B of at least a portion of the memory cell array as shown in FIG. 11 in accordance with an embodiment of the present disclosure.

Referring to FIG. 13, there is shown a cross-sectional view along line B-B of at least a portion of the memory cell array 20 as shown in FIG. 11 in accordance with an embodiment of the present disclosure. The cross-sectional view as shown in FIG. 13, may be similar to the cross-sectional view as shown in FIG. 7, except that the source region 320 may be formed of a P-type semiconductor material.

At this point should be noted that techniques for providing a semiconductor memory device in accordance with the present disclosure as described above may involve the processing of input data and the generation of output data to some extent. This input data processing and output data generation may be implemented in hardware or software. For example, specific electronic components may be employed in a semiconductor memory device or similar or related circuitry for implementing the functions associated with providing a semiconductor memory device in accordance with the present disclosure as described above. Alternatively, one or more processors operating in accordance with instructions may implement the functions associated with providing a semiconductor memory device in accordance with the present disclosure as described above. If such is the case, it is within the scope of the present disclosure that such instructions may be stored on one or more non-transitory processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of at least one particular implementation in at least one particular environment for at least one particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A semiconductor memory device comprising: a plurality of memory cells arranged in an array of rows and columns, each memory cell comprising:
   a first region coupled to a source line;
   a second region coupled to a bit line;
   a body region capacitively coupled to at least one word line via a gate region and disposed between the first region and the second region, wherein the body region comprises a plurality of floating body regions and a plurality of floating gate regions capacitively coupled to the at least one word line, and wherein the first region, the second region, and the body region are disposed in a sequential contiguous relationship and extend vertically from a plane defined by a substrate.

2. The semiconductor memory device according to claim 1, wherein the substrate is an N+ substrate.

3. The semiconductor memory device according to claim 2, wherein the first region and the second region are doped with donor impurities.

4. The semiconductor memory device according to claim 2, wherein the gate region comprises two end portions and a middle portion.

5. The semiconductor memory device according to claim 4, wherein the two end portions of the gate region are formed of a thermal oxide layer or an oxide layer.

6. The semiconductor memory device according to claim 4, wherein the middle portion of the gate region is formed of a nitride material embedded in an oxide material or a thermal oxide material.

7. The semiconductor memory device according to claim 6, wherein the embedded nitride material of the gate region is configured to store charge carriers.

8. The semiconductor memory device according to claim 1, wherein the at least one word line comprises a plurality of gate lines.

9. The semiconductor memory device according to claim 8, wherein the plurality of gate lines of the at least one word line comprise a plurality of select gate lines and a plurality of control gate lines.

10. The semiconductor memory device according to claim 9, wherein the plurality of control gate lines are disposed between the plurality of select gate lines.

11. The semiconductor memory device according to claim 9, wherein the plurality of select gate lines and the plurality of control gate lines are formed of different lengths.

12. The semiconductor memory device according to claim 9, wherein the plurality of select gate lines are capacitively coupled to a corresponding first floating body region and a corresponding second floating body region and the plurality of control gate lines are capacitively coupled to a plurality of corresponding floating body regions between the first corresponding floating body region and the second corresponding floating body region.

13. The semiconductor memory device according to claim 9, wherein the plurality of select gate lines are coupled to a corresponding plurality of select gate line contacts and the plurality of control gate lines are coupled to a corresponding plurality of control gate line contacts.

14. The semiconductor memory device according to claim 13, wherein the plurality corresponding select gate line contacts and the plurality corresponding control gate line contacts are formed of different length.

15. The semiconductor memory device according to claim 2 wherein the first region comprises a continuous planar region.

16. The semiconductor memory device according to claim 15, wherein the first region further comprises a plurality of protrusions formed on the continuous planar region.

17. The semiconductor memory device according to claim 2, wherein each memory cell further comprises a P+ region disposed between the first region and the N+ substrate.

18. The semiconductor memory device according to claim 2 wherein the first region is doped with acceptor impurities.

19. The semiconductor memory device according to claim 1, wherein the substrate defines a horizontal plane.

20. The semiconductor memory device according to claim 19, wherein the first region is doped with donor impurities.

21. The semiconductor memory device according to claim 20, wherein the source line is coupled to a plurality of source line contacts.

22. The semiconductor memory device according to claim 21, wherein the plurality of source line contacts are coupled to two contiguous columns of the plurality of memory cells.

23. The semiconductor memory device according to claim 20, wherein each memory cell further comprises a P+ region disposed between two contiguous columns of the plurality of memory cells.

24. The semiconductor memory device according to claim 19, wherein the first region is doped with acceptor impurities.

25. The semiconductor memory device according to claim 24, wherein the first region is the first region of a plurality of memory cells.

26. A method for biasing a semiconductor memory device comprising the steps of:
applying a plurality of voltage potentials to a plurality of memory cells arranged in an array of rows and columns, wherein applying the plurality of voltage potentials to the plurality of memory cells comprises:
applying a first voltage potential to a first region of each of the plurality of memory cells;
applying a second voltage potential to a second region of each of the plurality of memory cells; and
applying a third voltage potential to a body region of each of the plurality of memory cells via at least one respective word line of the array that is capacitively coupled to the body region via a gate region, wherein the body region comprises a plurality of floating body regions and a plurality of floating gate regions capacitively coupled to the at least one word line, and wherein the first region, the second region, and the body region are disposed in a sequential contiguous relationship and extend vertically from a plane defined by a substrate.

27. The method according to claim 26, further comprising coupling a P+ region to an electrical ground.

28. The method according to claim 27, wherein the first voltage potential applied to the first region forward biases a junction between the first region and the P+ region in order to perform a write logic low operation.

29. The method according to claim 28, wherein the third voltage potential applied to the body region via the at least one respective word line is a negative voltage potential to repel majority charge carriers from the body region in order to perform the write logic low operation.

30. The method according to claim 27, wherein the second voltage potential applied to the second region and the third voltage potential applied to the body region via the at least one respective word line are positive voltage potentials in order to perform a write logic high operation.

31. The method according to claim 30, wherein the positive voltage potentials applied to the second region and the body region to invert a surface to perform the write logic high operation.

32. The method according to claim 31, wherein majority charge carriers are injected into the body region via the inverted surface between the second region and the body region in order to perform the write logic high operation.

* * * * *